(12) United States Patent
Yamaoka et al.

(10) Patent No.: US 8,451,050 B2
(45) Date of Patent: May 28, 2013

(54) INFORMATION TECHNOLOGY EQUIPMENT

(75) Inventors: Masanao Yamaoka, White Plains, NY (US); Kenichi Osada, Tokyo (JP); Minoru Motoyoshi, Ome (JP); Tetsuya Fukuoka, Hamura (JP)

(73) Assignee: Hitachi, Ltd., Tokyo (JP)

( * ) Notice: Subject to any disclaimer, the term of this patent is extended or adjusted under 35 U.S.C. 154(b) by 19 days.

(21) Appl. No.: 12/987,112

(22) Filed: Jan. 8, 2011

(65) Prior Publication Data
US 2011/0221516 A1 Sep. 15, 2011

(30) Foreign Application Priority Data
Mar. 12, 2010 (JP) ................. 2010-055272

(51) Int. Cl.
*G05F 1/10* (2006.01)
(52) U.S. Cl.
USPC ........................................................ 327/538
(58) Field of Classification Search
USPC .................. 327/534, 535, 538, 540, 541, 543
See application file for complete search history.

(56) References Cited

U.S. PATENT DOCUMENTS

| | | | | |
|---|---|---|---|---|
| 7,145,383 B2 * | 12/2006 | Mizuno et al. | ................ | 327/546 |
| 7,205,826 B2 * | 4/2007 | Kim et al. | ...................... | 327/538 |
| 7,414,458 B2 * | 8/2008 | Wu et al. | ....................... | 327/540 |
| 7,746,162 B2 * | 6/2010 | Gouin | ............................ | 327/538 |
| 7,839,205 B2 * | 11/2010 | Hirobe | .......................... | 327/540 |
| 8,120,410 B2 * | 2/2012 | Meijer et al. | .................. | 327/534 |

FOREIGN PATENT DOCUMENTS

JP 2008-034667 A 2/2008

* cited by examiner

*Primary Examiner* — Jeffrey Zweizig
(74) *Attorney, Agent, or Firm* — Miles & Stockbridge P.C.

(57) ABSTRACT

Information technology equipment includes a circuit block, a local power source line for supplying a power source to the circuit block, a power source line, and a first transistor which is provided with a source-drain path thereof between the power source line and the local power source line, in which the first transistor is controlled to an OFF state in a first state, and is controlled to an ON state in a second state, and when the first state is shifted to the second state, the first transistor is controlled such that a rate of changing a current flowing in the source-drain path of the first transistor does not exceed a predetermined value.

20 Claims, 25 Drawing Sheets

|        | MCS1 | MCS2 | MCS3 | MCS4 | MCS5 | MCS6 | MCS7 | LOGIC |
|--------|------|------|------|------|------|------|------|-------|
| L (nm) | 400  | 400  | 200  | 200  | 100  | 100  | 50   | 50    |
| W (nm) | 200  | 300  | 200  | 300  | 200  | 300  | 400  | 100   |

MPSW1  LOGIC1

|  | CLK | NUMBER OF COUNTER STAGES |
|---|---|---|
| CASE1 | HIGH SPEED | LARGE |
| CASE2 | MIDDLE SPEED | MIDDLE |
| CASE3 | LOW SPEED | SMALL |

|  | POWER SOURCE IMPEDANCE | NUMBER OF COUNTER STAGES |
|---|---|---|
| CASE4 | HIGH | LARGE |
| CASE5 | MIDDLE | MIDDLE |
| CASE6 | LOW | SMALL |

|  | POWER SOURCE IC RESPONSE | NUMBER OF COUNTER STAGES |
|---|---|---|
| CASE7 | LOW SPEED | LARGE |
| CASE8 | MIDDLE SPEED | MIDDLE |
| CASE9 | HIGH SPEED | SMALL |

|  | NUMBER OF CONTROL STAGES | POWER SOURCE IMPEDANCE | POWER SOURCE IC RESPONSE |
|---|---|---|---|
| CASE11 | SMALL | LOW | HIGH SPEED |
| CASE12 | MIDDLE | MIDDLE | MIDDLE SPEED |
| CASE12 | LARGE | HIGH | LOW SPEED |

MPSSW1  MPLSW1           LOGIC1         ■ : BUF2

|        | MCS1 | MCS2 | MCS3 | MCS4 | MCS5 | MCS6 | MCS7 | LOGIC |
|--------|------|------|------|------|------|------|------|-------|
| L (nm) | 400  | 400  | 400  | 200  | 100  | 100  | 50   | 50    |
| W (nm) | 200  | 200  | 200  | 200  | 200  | 300  | 400  | 100   |

|        | MCS1 | MCS2 | MCS3 | MCS4 | MCS5 | MCS6 | MCS7 | LOGIC |
|--------|------|------|------|------|------|------|------|-------|
| L (nm) | 400  | 400  | 400  | 200  | 100  | 100  | 50   | 50    |
| W (nm) | 200  | 150  | 200  | 200  | 200  | 300  | 400  | 100   |

INFORMATION TECHNOLOGY EQUIPMENT

CLAIM OF PRIORITY

The present application claims priority from Japanese patent application JP 2010-055272 filed on Mar. 12, 2010, the content of which is hereby incorporated by reference into this application.

FIELD OF THE INVENTION

The present invention relates to information technology equipment which is provided with a power source interrupting system for reducing power at standby.

BACKGROUND OF THE INVENTION

In accordance with miniaturization of a semiconductor fabrication technology, a current which is referred to as a leakage current flowing in a transistor which is turned OFF is increased, and a problem is posed by an increase in power owing to a leakage current of a circuit which is not operated. As a technology of suppressing the leakage current, there has been used a power source interrupting technology of reducing a leakage current by interrupting a power source when a circuit is not operated.

FIG. 34A and FIG. 34B show an outline of a power source interrupting technology. In a state ACTIVE in which a circuit is operated, the circuit LOGIC1 is normally operated by applying a potential the same as a power source voltage VDD to a local power source VDCL which is a power source of the circuit LOGIC1. In a standby state STAND-BY in which the circuit is not operated, by setting high a potential of a control line CSW of a power source switch. SW which is inserted between the power source VDCL of the circuit and a power source line VDD, the power source switch is interrupted. Thereby, a potential of the local power source VDCL is lowered, and a leakage current Ileak flowing in the circuit LOGIC1 can be reduced. In a case where the standby state recovers to an operating state, when the power source switch SW is abruptly turned ON, a large current for charging the local power source flows abruptly, thereby, a large power source noise is generated at the power source VDD, and there is a possibility that a circuit of a portion at which the power source is not interrupted causes an erroneous operation.

Therefore, in order to resolve the problem, there has been a technology of suppressing generation of a power source noise by setting a potential of a control line of a power source switch to an intermediate potential for a constant period of time in recovering from power source interruption, making a change in a potential of a local power source during a time period of shifting from a standby state to an operating state gradual, and restraining a current I (SW) flowing in a power source switch SW to be small during the time period as described in FIG. 5 of Japanese Unexamined Patent Publication No. 2008-34667 (JP-A-2008-34667).

SUMMARY OF THE INVENTION

However, in order to achieve an object of reducing the leakage current, the invention described in JP-A-2008-34667 is insufficient. Because not only an increased in a current for charging VDCL, but also an increase in a leakage current by setting the potential of VDCL high causes the power source noise. An explanation will be given of a problem of a power source noise reducing technology according to JP-A-2008-34667 in reference to FIGS. 35A, 35B, and 35C and FIG. 36.

FIG. 35A shows a comparison of currents I (SW) flowing in a switch SW when VDCL and CSW are controlled similarly to JP-A-2008-34667. Particularly, a dotted line conceives a circuit in which there is not a significant change in the leakage current Ileak even when the potential of VDCL rises, a bold line conceives a circuit in which the leakage current Ileak increases in accordance with a change in the potential of VDCL, and FIG. 35A illustrates the currents I (SW) flowing in the switch SW in cases of the both. FIG. 35B shows the potential of the control line CSW in the control, and FIG. 35C shows the potential of the local power source line VDCL in the control. Further, although with regard to a maximum value of the current I (SW) in FIG. 35A, a value of, for example, 10.0 A or the like corresponds thereto, the maximum value is a matter of design, and is not limited to a specific value. In FIGS. 35B and 35C, a case where the power source voltage is 1.0 V is conceived, and a maximum value of the potential V (CSW) and a maximum value of the potential V (VDCL) are indicated as 1.0 V.

Unlike a case in which there is not a significant change in the leakage current Ileak as in the dotted line of FIG. 35A, in a case of the bold line of FIG. 35A, it is known that the leakage current Ileak is increased in accordance with an increase in the potential V (VDCL), I (SW) is increased in accordance therewith, and as a result, the power source noise is caused.

Further, FIG. 36 shows a path through which a current flows when LSI a power source of which is to be interrupted recovers from a standby state. In FIG. 36, notation MOD2 designates a circuit block a power source of which is interrupted, notation MOD1 designates a circuit block the power source of which is not interrupted in the same LSI, notation LSI1 designates an LSI mounted with the circuit blocks, notation BOARD1 designates a board mounted with the LSI, notation CAP1 designates a capacitor added to a power source mounted on the board, and notation POW1 designates a power source IC for supplying a power source to the LSI. In information technology equipment having such a circuit, when recovering from a standby state, an increased leakage current Ileak is supplied by a current Imod1 from the circuit block MOD1 the power source of which is interrupted, and a current Icap from the capacitor CAP1. Here, Imod1 and Icap are currents supplied by electric charges accumulated in capacitors, and therefore, Imod1 and Icap are limited. In contrast thereto, the leakage current Ileak always continues flowing, and therefore, electric charges for making the leakage current Ileak flow cannot be continued to supply by Imod1 and Icap which are limited. Therefore, a reduction in the power source voltage by Ileak is brought about and the power source noise is generated thereby.

When the above-described is summarized, in the invention described in JP-A-2008-34667, there is only carried out power source control for constituting the potential of the power source switch control line to be the intermediate potential, and therefore, it is not taken into consideration that the potential of the local power source is gradually increased. Therefore, there poses a problem in the prior art technology by the power source noise owing to the increase in the leakage current in accordance with an increase in the potential of the local power source.

Representative ones of the means for resolving the problem by the present invention are as follows.

First, there is provided information technology equipment including a circuit block, a local power source line for supplying a power source to the circuit block, a power source line, and a first transistor which is provided with a source-drain path thereof between the power source line and the local power source line, in which the first transistor is controlled to an OFF state in a first state, and controlled to an ON state in a second state, and when the first state is shifted to the second state, the first transistor is controlled such that a rate of changing a current flowing in the source-drain path of the first transistor does not exceed a predetermined value.

Second, there is provided information technology equipment including a circuit block, a local power source line for supplying a power source to the circuit block, a power source line, and a first transistor which is provided with a source-drain path thereof between the power source line and the local power source line, in which the first transistor is controlled to an OFF state in a first state, and controlled to an ON state in a second state, and when the second state is shifted to the first state, the first transistor is controlled such that a rate of changing a current flowing in the source-drain path of the first transistor does not exceed a predetermined value.

Third, there is provided information technology equipment including an LSI including a circuit block and having a first state, and a second state in which power supplied to the circuit block is larger than power supplied to the circuit block in the first state, and a power source IC of supplying a power source to the LSI by way of a power source line, in which the LSI receives a first control signal from outside of the LSI, the LSI selects first control or second control in which a rate of changing a current supplied to the circuit block is larger than a rate of changing the current supplied to the circuit block in the first control based on the first control signal when the first state shifts to the second state, and the first control signal is changed based on an impedance of the power source line, or a response speed of the power source IC in correspondence with the rate of changing the current.

According to the present invention, the leakage current can be reduced more efficiently than that in the background art.

DETAILED DESCRIPTION OF THE PREFERRED EMBODIMENTS

Representative information technology equipment of the present invention is constructed by a constitution of carrying out control of restraining a change in an amount of a current flowing in an LSI to be equal to or smaller than a constant value in recovering from interruption of a power source in the LSI having a power source interrupting function. A detailed explanation will be given of respective embodiments of the present invention in reference to the drawings as follows.

First Embodiment

Figure 1:
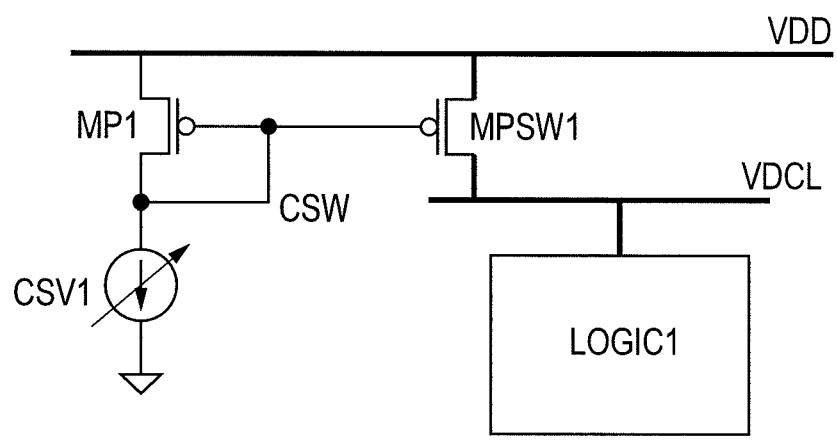
FIG. 1 is a basic constitution diagram of a power source interrupting control circuit using the present invention.

FIG. 1 shows a basic constitution of a power source interrupting control circuit using the present invention. FIG. 1, notation LOGIC1 designates a circuit block, notation MPSW1 designates a power source switch of interrupting a power source of LOGIC1, notation VDD designates a power source line, notation VDCL designates a local power source line constituting the power source of LOGIC1, notation CSW designates a control line of the power source switch, notation MP1 designates a PMOS transistor constituting a current mirror, and notation CSV1 designates a variable current source which can control a current.

According to the circuit, when the circuit block LOGIC1 is operated, CSW becomes a low potential, the power source switch MPSW1 is turned ON, thereby, the local power source VDCL is connected to the power source line VDD, the power source is supplied to LOGIC1, and LOGIC1 is normally operated. In a standby state in which the circuit block LOGIC1 is not operated, CSW becomes a high potential, the power source switch MPSW1 is turned OFF, and the local power source VDCL is cut from the power source line VDD. Thereby, supply of the power source to LOGIC1 is interrupted, a leakage current flowing in a transistor constituting LOGIC1 is reduced, and power consumption of LOGIC1 can be reduced.

In recovering from the standby state, it is necessary to turn the power source switch MPSW1 ON by setting the control signal CSW of the power source switch transit from high to low. When an operation of turning the power source switch ON is carried out abruptly, the leakage current of LOGIC1 is abruptly increased in accordance with rise of a VDCL potential, and a power source noise is generated at the power source line VDD. In order to resolve such a problem, a circuit according to the present embodiment is controlled such that a rate of a change in a current flowing in a source-drain path of the first transistor (MPSW1) does not exceed a predetermined value in shifting from a standby state (first state) to an operating state (second state). The power source noise generated at the power source line VDD can be restrained by such control. Further, such control can be realized by determining a current of MPSW1 by gradually increasing a current of the variable current source CSV1, and amplifying the current by the current mirror constituted by MP1 and MPSW1.

Figure 2A:
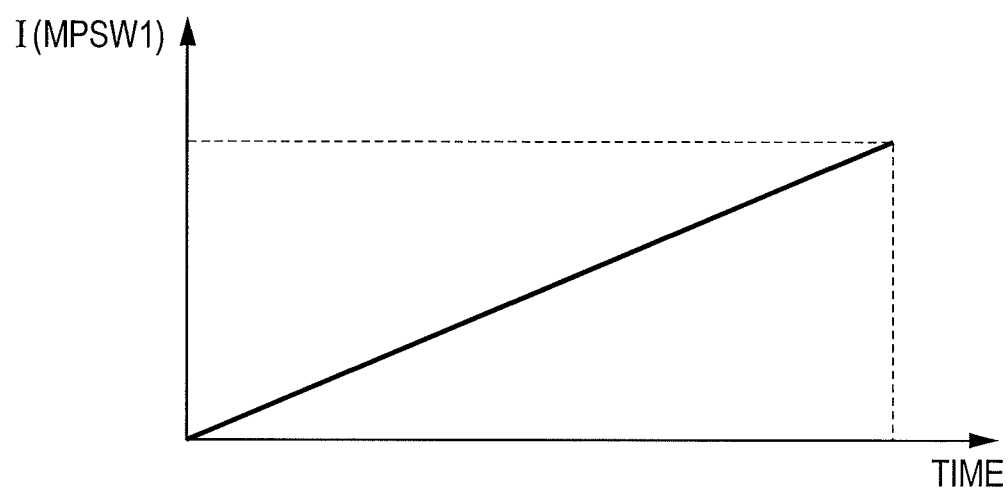
FIG. 2A is a waveform diagram showing a current flowing in a power source switch in operation of the power source interrupting control circuit using the present invention.
Figure 2B:
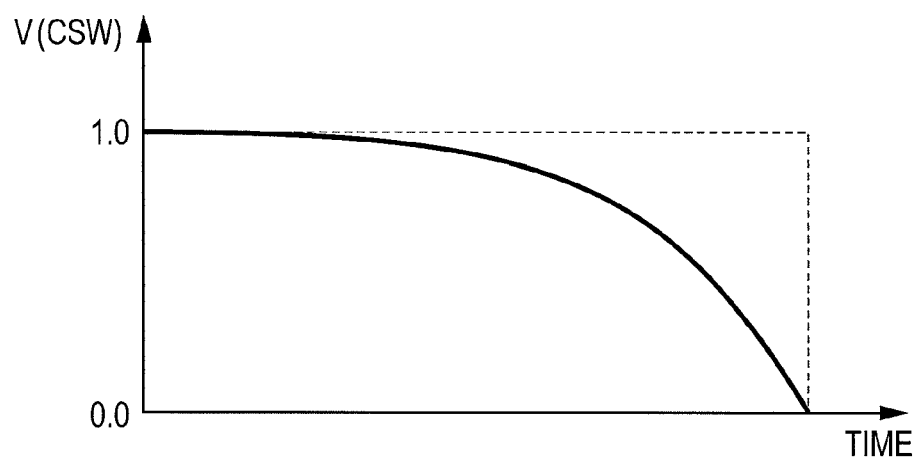
FIG. 2B is a waveform diagram showing a potential of a control signal of a power source switch in operation of the power source interrupting control circuit using the present invention.
Figure 2C:
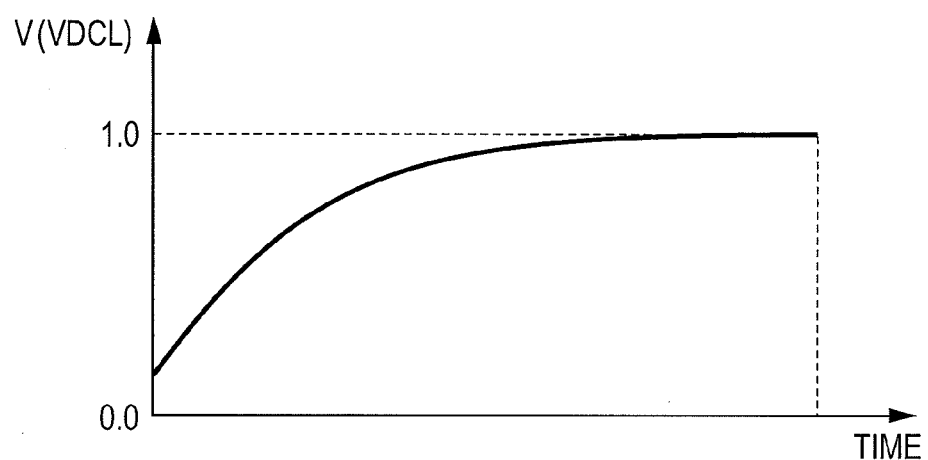
FIG. 2C is a waveform diagram showing a potential of a local power source in operation of the power source interrupting control circuit using the present invention.
Figure 35A:
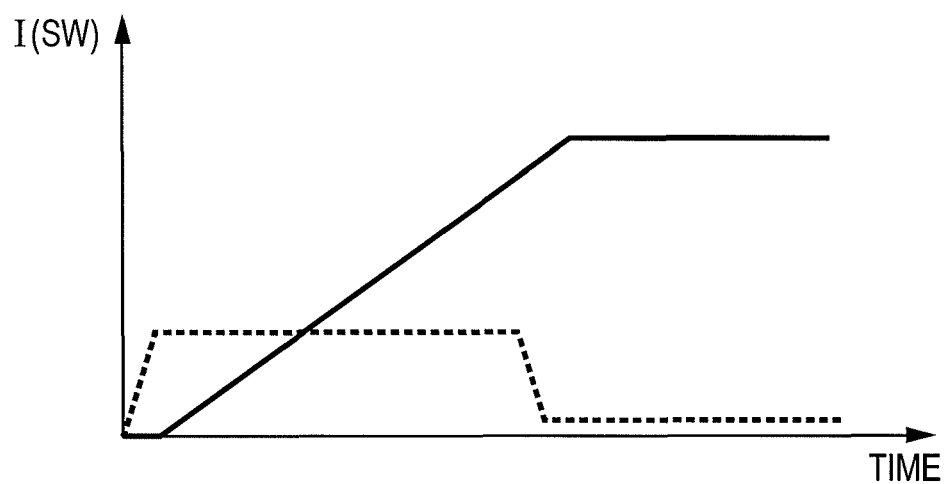
FIG. 35A is a waveform diagram showing a current flowing in a power source switch showing a problem resolved by the present invention.
Figure 35B:
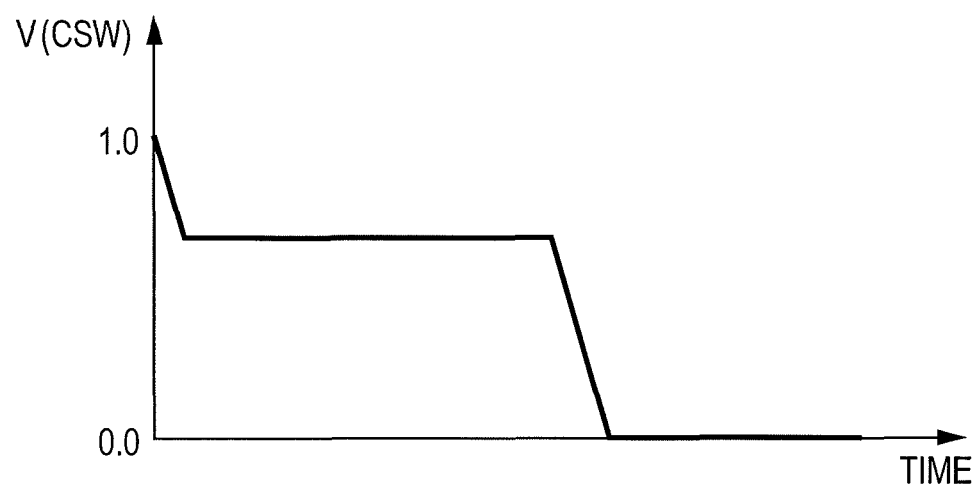
FIG. 35B is a waveform diagram showing a potential of a control signal of the power source switch showing the problem resolved by the present invention.
Figure 35C:
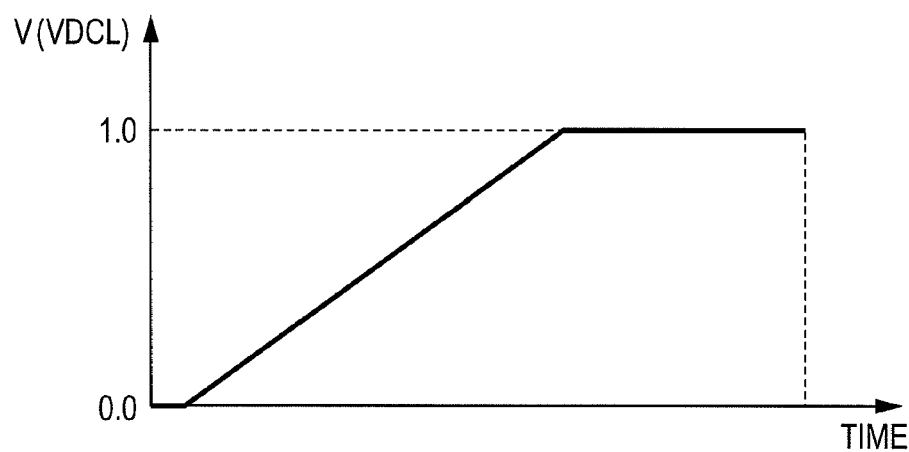
FIG. 35C is a waveform diagram showing a potential of a local power source showing the problem resolved by the present invention.
Figure 36:
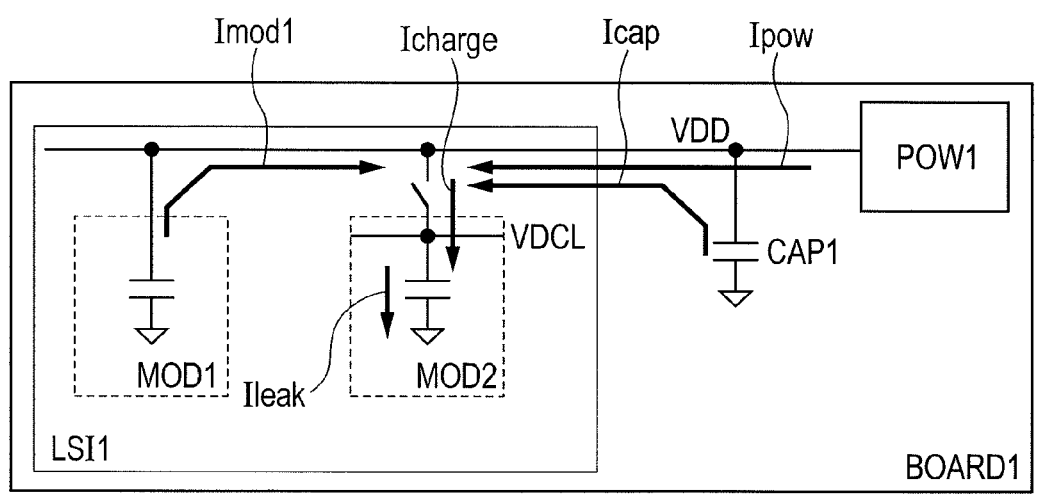
FIG. 36 is a diagram showing the problem on a board resolved by the present invention.

FIG. 2A through FIG. 2C show changes in a current and voltages at respective portions of the circuit. As shown by FIG. 2A, a current I (MPSW1) of the power source switch MPSW1 is increased by a constant inclination. FIG. 2B shows a potential of the control signal CSW of the power source switch at this occasion. As is known from FIG. 2B, the change in the voltage V (CSW) of the control signal CSW of the power source switch is increased with an elapse of time, thereby, the change in the current of MPSW1 becomes constant. Further, FIG. 2C shows a potential of the local power source VDCL at this occasion. Further, methods of describing ordinates of FIG. 2A through FIG. 2C are similar to those of corresponding ones of FIG. 35A through FIG. 35C.

As is known from FIG. 2C, the change in the voltage V (VDCL) of the local power source VDCL is large at an initial stage of a time period of shifting from the standby state to the operating state, and a rate of changing the voltage becomes small as the voltage of the local power source VDCL becomes high. This is because a rate of changing a leakage current flowing in the circuit block LOGIC1 becomes large as the potential of VDCL becomes high, and therefore, in order to make a rate of changing the leakage current to be equal to or smaller than a constant value, it is necessary to make the rate of changing the voltage of VDCL small when the potential of VDCL become high. The relationship of the current and the voltages shown in FIG. 2A through FIG. 2C can be realized by using the variable current source and the current mirror circuit as shown by FIG. 1.

Figure 3:
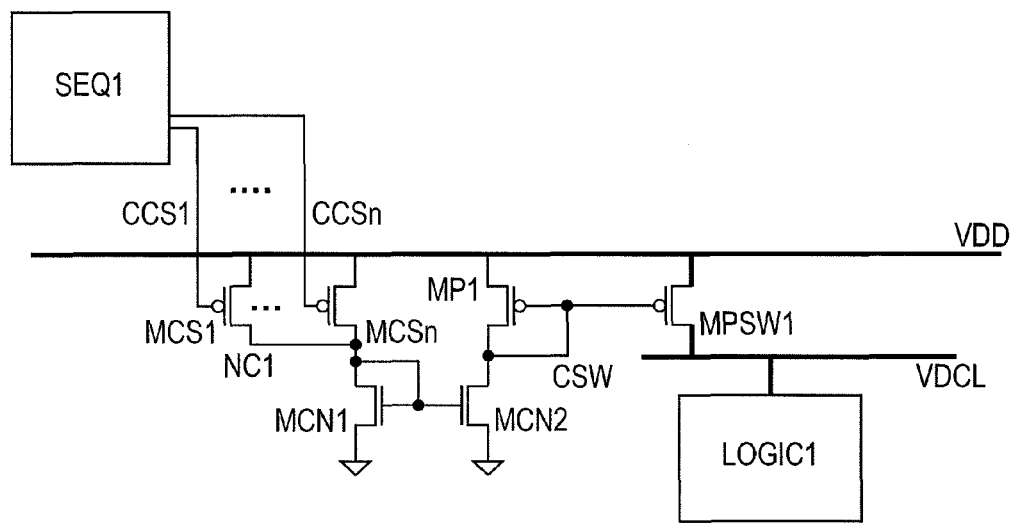
FIG. 3 is a circuit diagram including a variable current source portion of the power source interrupting control circuit using the present invention.

FIG. 3 shows an example of a circuit when a portion of the variable current source of the power source interrupting control circuit is constituted by using a current source and a current mirror of PMOS. In FIG. 3, notations MCN1 and MCN2 designate NMOS transistors constituting a current mirror, notation NC1 designates a node connected with a current source, notations MCS1 through MCSn designate PMOS transistors constituting current sources, notations CCS1 through CCSn designate signals controlling the current sources MCS1 through MCSn, and notation SEQ1 designates a circuit of generating CCS1 through CCSn. In the circuit, when the circuit block LOGIC1 is recovered from interruption of a power source, MCS1 through MCSn which are PMOS's constituting the current sources are turned ON successively at certain constant time intervals. Currents respectively flowing in the transistors MCS1 through MCSn from the power source line VDD flow to the node NC1. Further, a current amplified by MCN1 and MCN2 constituting the current mirror connected to NC1 flows to a drain electrode of MP1. Therefore, when MCS1 through MCSn are successively turned ON, the current flowing in MP1 is gradually increased, and the potential of VDCL can be made to rise by restraining the rate of changing the current flowing in MPSW1 to a constant value or smaller in accordance therewith.

Figure 4A:
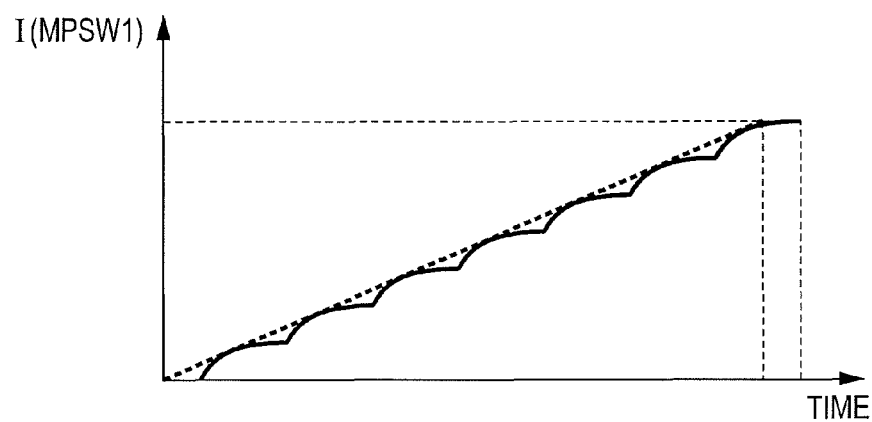
FIG. 4A is a waveform diagram showing a current flowing in a power source switch in operation of the power source interrupting control circuit using the present invention.
Figure 4B:
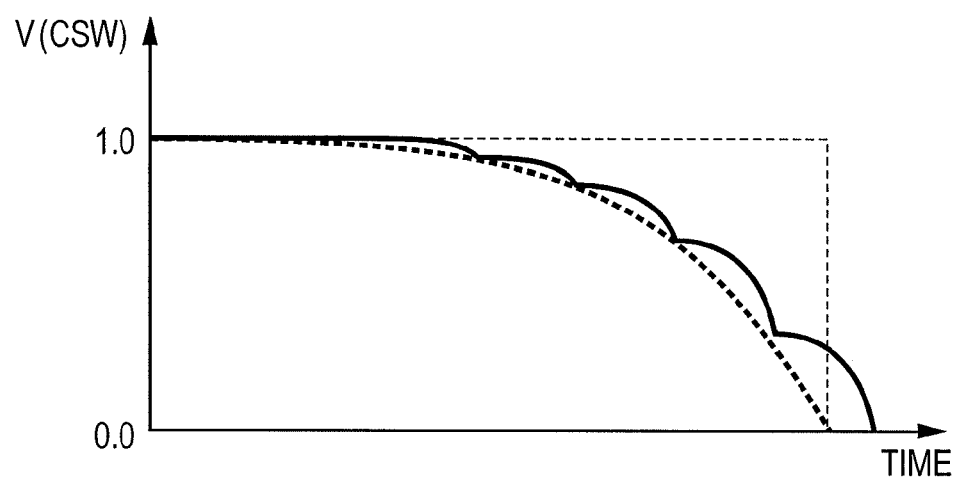
FIG. 4B is a waveform diagram showing a potential of a control signal of a power source switch in operation of the power source interrupting control circuit using the present invention.
Figure 4C:
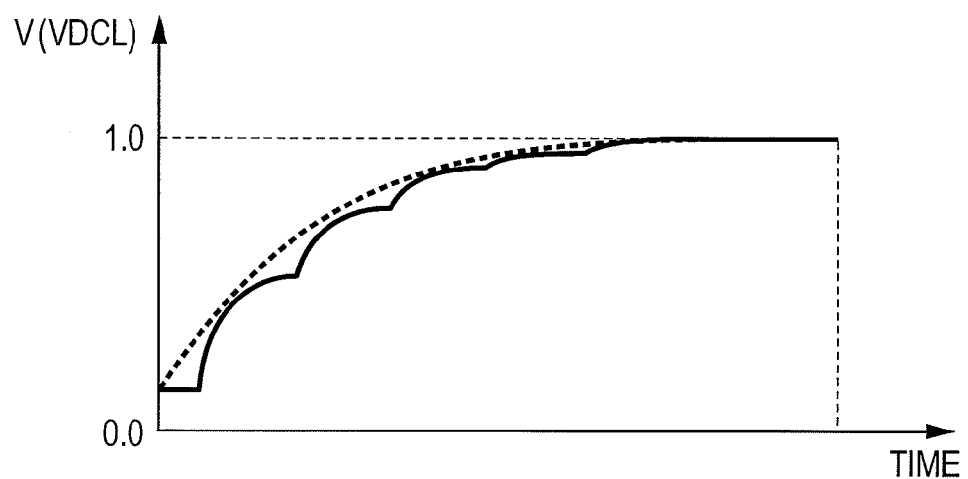
FIG. 4C is a waveform diagram showing a potential of a local power source in operation of the power source interrupting control circuit using the present invention.

FIG. 4A through FIG. 4C show a change in a current and voltages of respective portions of the circuit when the circuit of FIG. 3 is used. In accordance with successively turning the transistors MCS1 through MSCn ON, the current at the node NC1 is increased discretely, and therefore, also the current I (MPSW1) flowing in the transistor MPSW1 is increased as shown by FIG. 4A, and as a result, also the leakage current flowing in MPSW1 is increased in steps. However, the current I (MPSW1) shows a waveform near to a dotted line which is a constant change of the current, the rate of changing the current I (MPSW1) does not exceed a predetermined value, and therefore, recovery from power source interruption can be carried out without generating a noise in the power source line VDD. Further, a current flowing in the variable current source is discretely increased, and therefore, as shown by FIG. 4B and FIG. 4C, also voltages of CSW and VDCL are changed in steps. A current amount of the current source and a time interval of turning the current source ON are determined by performance of the circuit and a parasitic capacitance of a power source line inside an LSI, a capacitor added to a power source outside the LSI, a capability of dealing with a change in a current of a power source IC for supplying a power source to the LSI and the like. As an example thereof, in LSI formed by 65 nm process, when a board of mounting a general LSI and a power source IC are used, a time interval of turning the current source ON can be determined to be 5 us, and a current increased by turning the current source ON can be determined to be 500 mA.

Further, it is difficult to realize an effect similar to that of the control explained in reference to FIG. 1 through FIG. 4C by providing the plural power source switches MPSW1 in place of using a current mirror circuit, thereafter, successively turning the plural power source switches MPSW1 ON. Because as shown in FIGS. 2A, 2B, 2C and FIGS. 4A, 4B, 4C, it is necessary to control the voltage V (CSW) by a value having a change which is not linear and control to linearly change the current I (MPSW1), it is necessary to increase the number of switches to be turned ON in accordance with a change in time, and as a result, an enormous number of the power source switches MPSW1 are needed, which is not realistic.

Figures 5, 6:
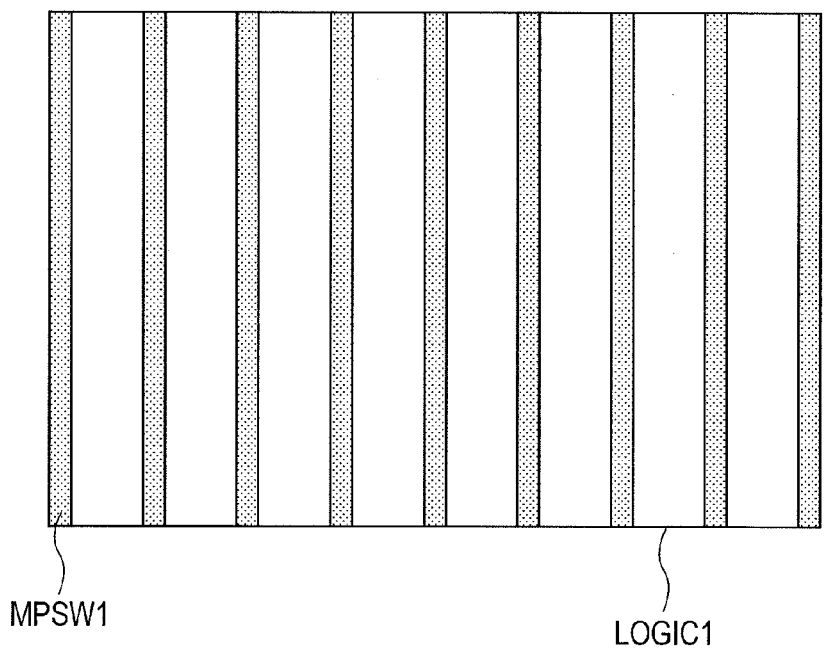
FIG. 5 shows an example of a size of a PMOS transistor constituting a current source when a circuit of the present invention is constituted.
FIG. 6 is an outline layout diagram of arranging a switch of a circuit to which the present invention is applied.

FIG. 5 shows an example of a size of a PMOS transistor constituting a current source when the circuit of the present invention is constituted by the 65 nm process. When a transistor which is to be turned ON at a later stage is turned ON, a potential of VDCL is more elevated than that at an initial stage, and therefore, more currents need to flow. Therefore, a gate length L having a small number is made larger than a gate length L of a transistor having a large number. Further, conversely, in a case of the same gate length, a gate width W of a transistor having a small number is made smaller than a gate width W of a transistor having a large number. Further, an amount of changing a leakage current is determined by a current of the transistor, and therefore, it is necessary that an amount of a magnitude of a current in fabricating LSI which is shifted from that in designing is small. That is, it is necessary that dispersion in the transistor constituting the current source is small. Therefore, as a transistor of the current source, a transistor having a large size is used. In Logic of FIG. 5, a size of the smallest transistor used in a logic circuit is shown, and a transistor larger than the smallest transistor is used as the current source.

Further, in comparison with an NMOS transistor, a PMOS transistor is featured in that a random dispersion is small. Therefore, although the current source can also be constituted by an NMOS transistor, when a PMOS transistor is used, dispersion thereof is small, and performance is improved. Further, when a current source having the same dispersion amount is designed in a case of using an NMOS transistor and a case of using a PMOS transistor, a smaller constitution can be constructed by using the PMOS transistor.

FIG. 6 shows an outline layout diagram in a case of arranging a switch to a circuit to which the present invention is applied. Inside the circuit block LOGIC1, transistors MPSW1 constituting power source switches are uniformly arranged. The present invention conceives a circuit block comparatively large power consumption, and therefore, it is necessary to make a size of a power source switch large, and the switches are arranged at an inner front face of the circuit block. However, when power consumption is small, a constitution of arranging the switches only at a peripheral portion of the circuit block can also be constructed.

Figure 7:
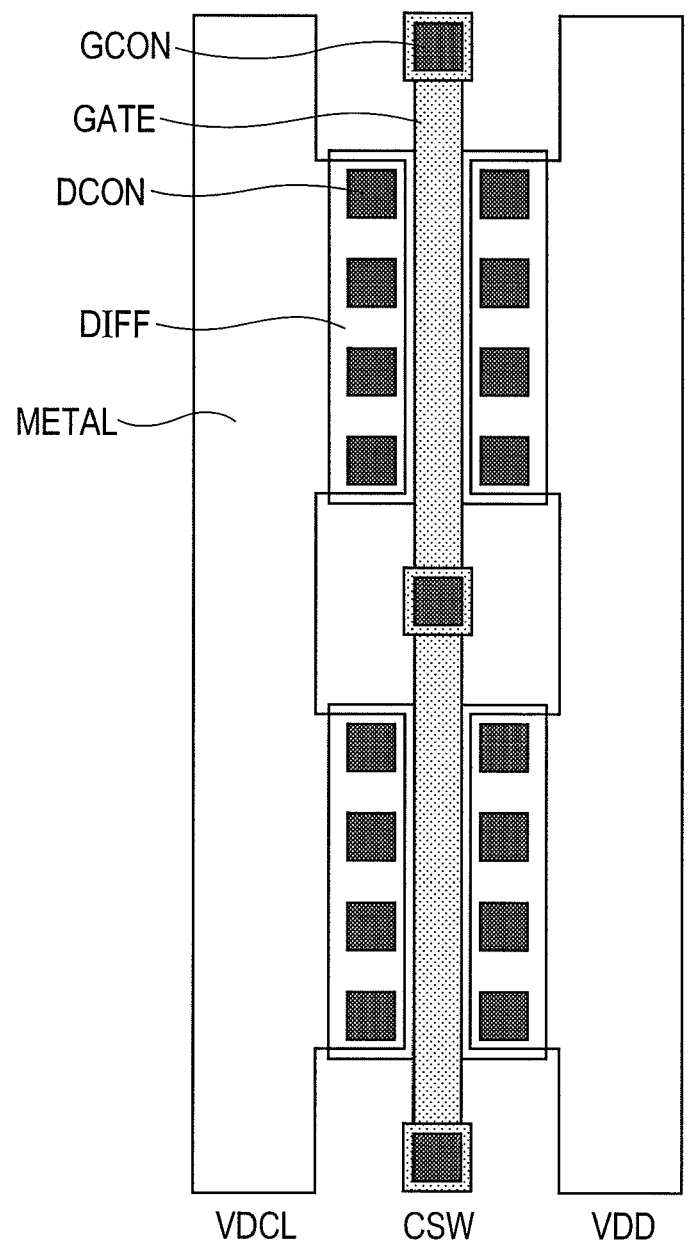
FIG. 7 is a layout diagram of a power source switch of a circuit to which the present invention is applied.

FIG. 7 shows an example of a layout of a power source switch in a circuit to which the present invention is applied. In FIG. 7, notation GATE designates a gate electrode of transistor constituting a switch, notation DIFF designates a diffusion layer of the transistor constituting the switch, notation GOON designates a gate contact, notation DCON designates a diffusion layer contact, and notation METAL designates a metal wiring. A layout of the switch is constituted by a form in which when switches of the same form are aligned in up and down directions, the switches can easily be connected, and the switches can be connected to be long in a vertical direction inside a circuit block as shown by FIG. 6. Further, when left and right sides are switched, the switches can easily be connected also in a horizontal direction, and in a case where it is necessary to increase the size of the switch, when plural rows of the layouts are aligned to arrange, the constitution as shown by FIG. 6 can be constructed. The signal CSW controlling the power source switch is inputted to a gate of the transistor constituting the power source switch, and by connecting the power source VDD to a source electrode, and connecting the local power source to a drain electrode, the power source switch can be controlled by the control signal CSW.

Figure 8:
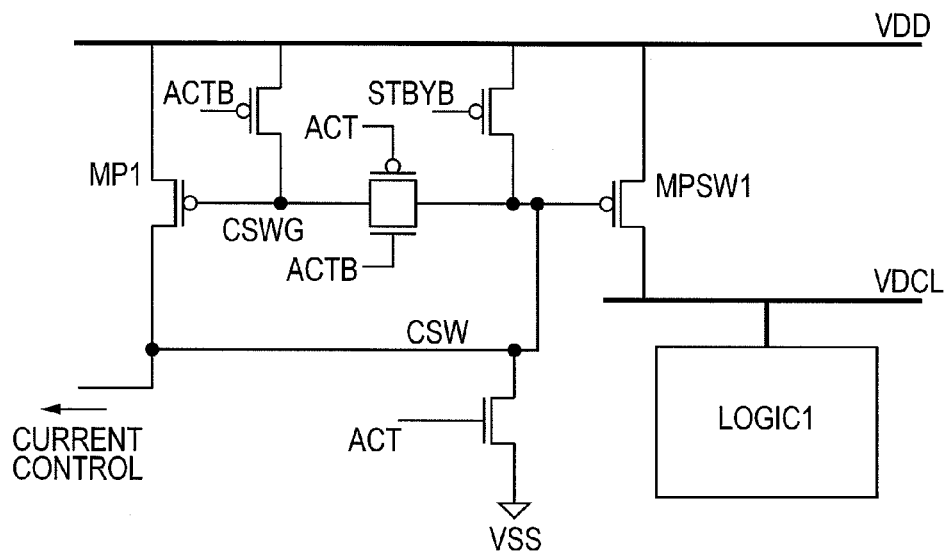
FIG. 8 is a circuit diagram of a power source switch control circuit to which the present invention is applied.

FIG. 8 shows a circuit diagram of a circuit added to the power source switch control circuit to which the present invention is applied. FIG. 3 and FIG. 8 correspond to each other, and FIG. 8 shows a circuit for fixing the signal CSW controlling the power source switch to a ground potential when a circuit of interrupting the power source is operated, and fixing the signal CSW to a power source potential when the power source is interrupted. A point of an arrow mark illustrated as Current control in FIG. 8 is connected to a drain terminal of MCN2 of FIG. 3.

An explanation will be given of an operation of the circuit by using an operation waveform of FIG. 9. When a power source of the circuit block is interrupted, that is, in a state of STAND-BY signal of FIG. 9, an ACT signal becomes low, an ACTB signal becomes high, and an STBYB signal becomes a low potential. Thereby, CSW becomes a high potential, and the power source switch MPSW1 is brought into an interrupted state. Further, a gate of the PMOS transistor MP1 constituting the current mirror is connected to CSW, and therefore, the gate becomes high.

Figure 9:
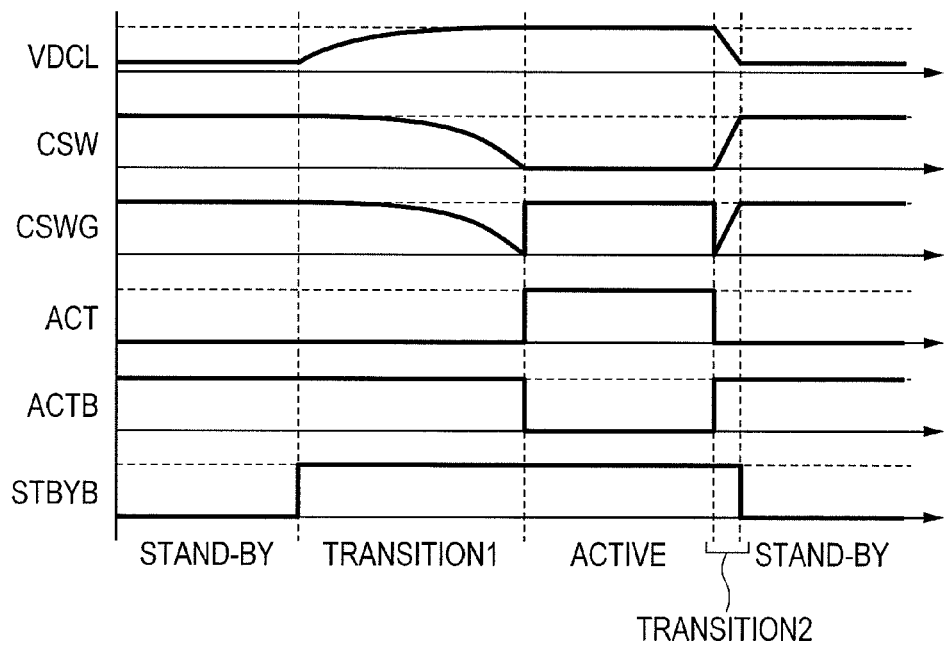
FIG. 9 shows an operational waveform of a circuit to which the present invention is applied.

When the circuit block is operated, and the power source is supplied to the circuit block, that is, in a state of ACTIVE of FIG. 9, the ACT signal becomes high, the ACTS signal becomes low, and the STBYB signal becomes a high potential. Thereby, CSW is fixed to a low potential, the power source switch MPSW1 is turned ON, and the circuit block LOGIC1 is supplied with the power source and is normally operated. Further, under the state, CSWG which is a gate of the PMOS transistor MP1 constituting the current mirror is separated from CSW and fixed to a high potential, MP1 is brought into an OFF state, and CSW can be made low.

Further, in a state of shifting from a power source interrupting state to power source ON, that is, in a state of TRANSITION1 of FIG. 9, the ACT signal becomes low, the ACTB signal becomes high, and the STBYB signal becomes a high potential. Thereby, the transistor fixing the potential of CSW is turned OFF, and the potential of CSW can be controlled by the current mirror. Further, it is known that in TRANSITION 1, the potentials of VDCL and CSW are gradually changed, and the potential of CSWG which is the gate of PMOS transistor MP1 constituting the current mirror is changed by the same potential as that of CSW.

Further, in a state of shifting from the power source ON to the power source interruption, that is, in a state of TRANSITION2 of FIG. 9, similarly to TRANSITION1, the ACT signal becomes low, the ACTB signal becomes high, and the STBYB signal becomes a high potential. When the power source is interrupted, a transition time period becomes short since only the power source switch may be interrupted.

Figure 10:
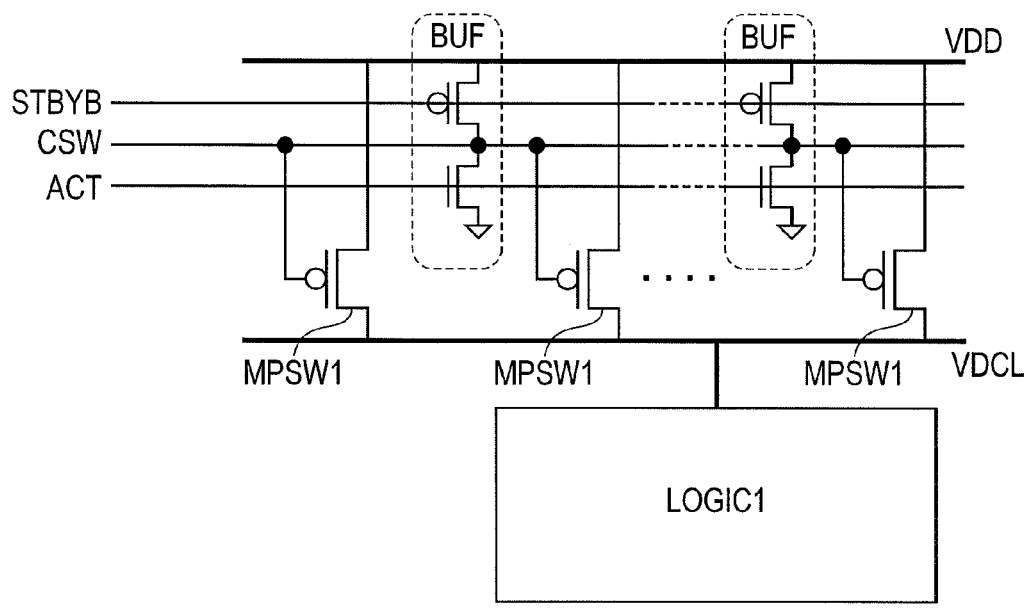
FIG. 10 is a circuit diagram of a power source switch control circuit to which the present invention is applied.

FIG. 10 shows a constitution of a power source switch control circuit to which the present invention is applied. As shown by FIG. 6, the PMOS transistors MPSW1 constituting the power source switches are arranged widely in the circuit block. Therefore, also control signals CSW thereof need to be distributed in the circuit block. In this case, there is a possibility that a parasitic resistance added to a wiring of CSW is present, and when a current of a gate leakage current or the like flows in the CSW line, a voltage drop is brought about, and the potential of CSW cannot be fixed to high or low. Therefore, it is necessary that a transistor (BUF in FIG. 10) for fixing CSW to high or low is divided to be arranged widely in the circuit block.

Figure 11:
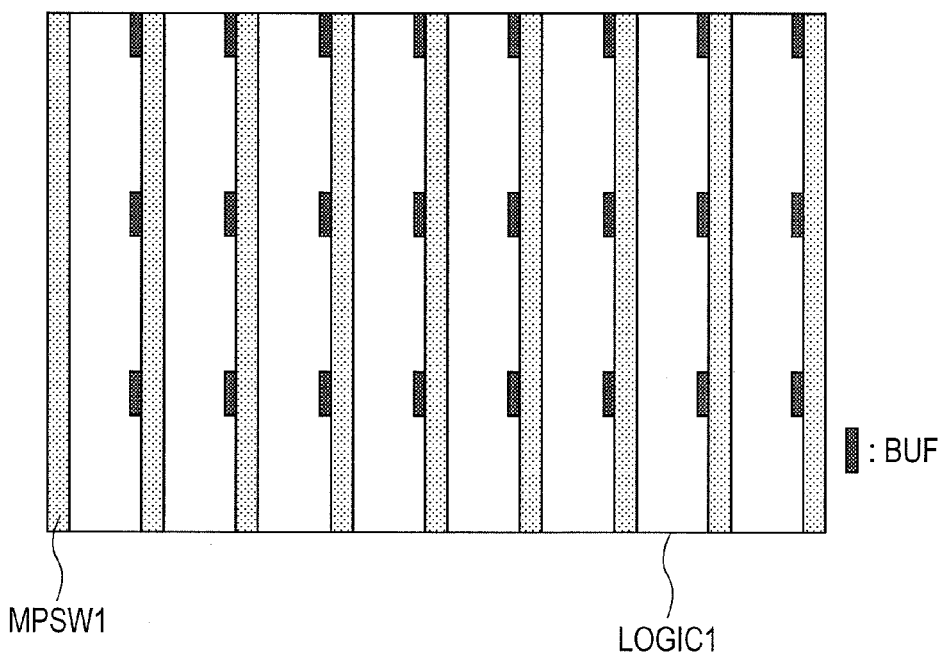
FIG. 11 is a layout diagram of a power source switch of a circuit to which the present invention is applied.

FIG. 11 shows an outline diagram of arranging the transistors. It is known that notation BUF in the diagram designates a position of the transistor for fixing the potential of CSW, which is divided to be arranged in the circuit block.

Figure 12:
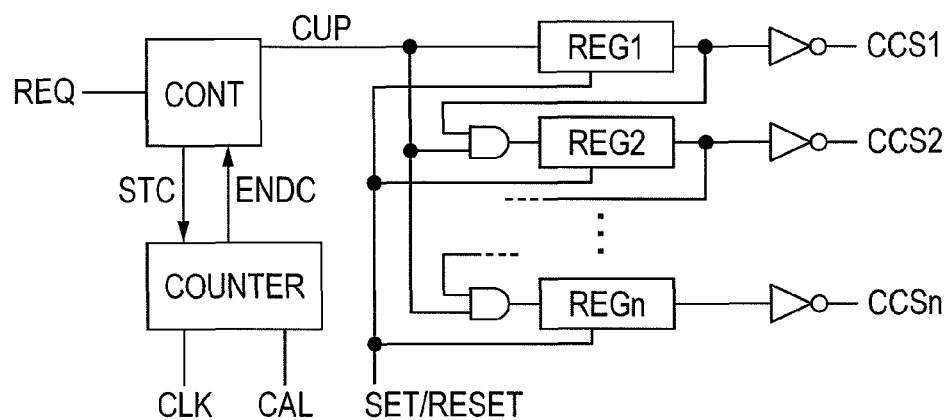
FIG. 12 is a circuit diagram of an operating signal outputting circuit in the power source interrupting control circuit using the present invention.

FIG. 12 shows a circuit of outputting signals for successively turning current sources ON in a power source interrupting control circuit using the present invention. The circuit is an example of the control circuit SEQ1 in FIG. 3. In FIG. 12, notation REQ designates a request signal indicating to start power source interruption, notation CONT designates a logic circuit of generating a control signal, notation COUNTER designates a counter circuit for counting to output a constant time period from a period of an inputted clock, notations CCS1 through CCSn designate control signals for controlling current sources, notations REG1 through REGn designate register circuits for preserving values of CCS1 through CCSn, notation SET/RESET designates a signal for setting or resetting the registers, notation STC designates a signal for starting a counter operation, notation ENDC designates a signal for showing that the counter operation is finished, notation CLK designates a clock signal inputted to the counter, and notation CAL designates a signal for setting a count value of the counter.

Figure 13:
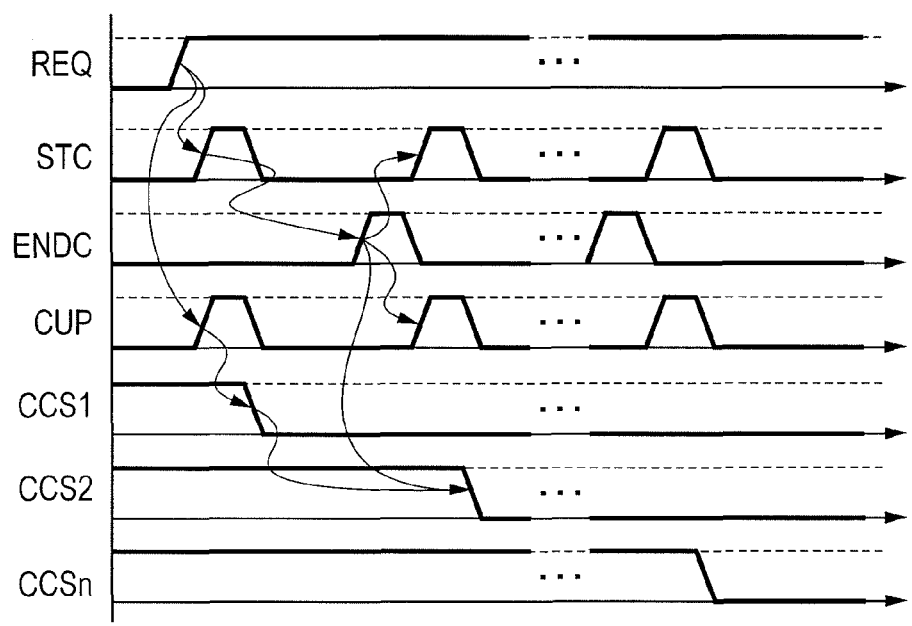
FIG. 13 is a waveform diagram of an operation of the operating signal outputting circuit.

According to the circuit, CCS1 through CCSn become successively low at respective times of inputting a signal designated as CUP. A detailed circuit operation will be explained in reference to a waveform diagram of FIG. 13.

When the signal REQ of executing power source interruption is inputted, CUP which is a signal of increasing a number of turning ON the signals CCS1 through CCSn for controlling the current sources is outputted. Thereby, when all of CCS1 through CCSn become high, first, CCS1 becomes low. Further, simultaneously with outputting CUP, the signal STC which starts counting of the counter circuit is outputted. The ENDC signal is outputted from the counter after an elapse of a constant time period from the signal by counting an input of constant clocks. CUP is outputted again from the signal of ENDC, and the signal STC of starting the counter operation is outputted again. When CUP is outputted, only CCS1 becomes low in CCS1 through CCSn, and therefore, a result of a logical product of an inverted signal of CCS1 and CUP is inputted to the register of preserving the value of CCS2, and in accordance therewith, CCS2 becomes low. By successively repeating the operation similarly, the signals of CCS1 through CCSn become low at constant time intervals. That is, when the signals of CCS1 through CCSn are inputted to the circuit of FIG. 3, the current flowing in the circuit the power source of which is interrupted can gradually be increased.

Figures 14, 15, 16A:
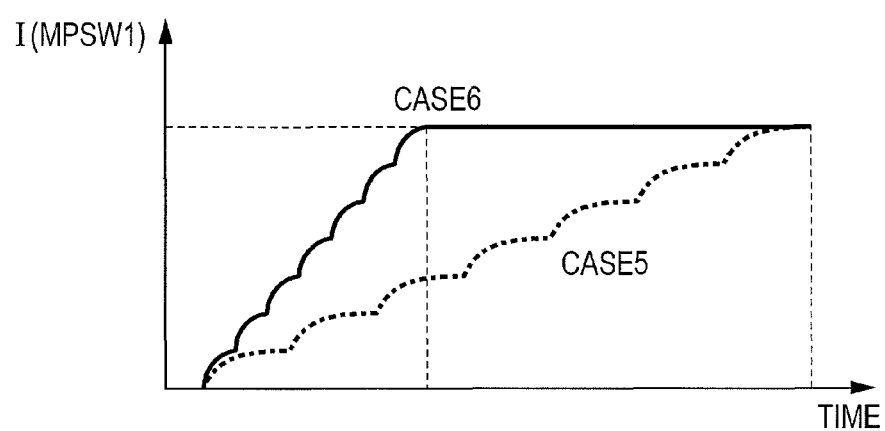
FIG. 14 shows a pattern of setting a counter stage number.
FIG. 15 shows a pattern of setting a counter stage number.
FIG. 16A is a waveform diagram showing a current flowing in a power source switch in operation of the power source interrupting control circuit using the present invention.

FIG. 14 shows a pattern for setting a number of stages of a counter. There is a possibility that a frequency of a clock inputted to the counter of the circuit of FIG. 12 differs by an LSI used. Therefore, when the number of stages of counting by the counter can be adjusted by the signal CAL, even in a case where a clock frequency differs, CCS1 through CCSn can be outputted with the same intervals. For example, in a case where an inputted clock is at high speed as in CASE1, the number of stages of counting by the counter is increased. Conversely, in a case where an inputted clock is at low speed as in CASE3, the number of stages of counting by the counter is reduced. By carrying out control in this way, current sources of FIG. 3 can be turned ON at constant intervals, and a rate of changing a current of the circuit block can be maintained to be constant.

FIG. 15 shows an example of changing a number of stages of the counter of the circuit of FIG. 12, that is, the intervals of outputting CCS1 through CCSn by an impedance of a power source of an LSI to which the present invention is applied and a board mounted with the LSI. Time intervals of turning CCS1 through CCSn ON, that is, the rate of changing the current flowing in the circuit block is restricted for preventing a noise from being generated by the impedance of the power source. Therefore, a noise can be restrained from being generated by setting the rate of changing the current charge high, that is, shortening the time interval of changing the current, or increasing an amount of the current increased by one time when the impedance of the power source is small. That is, in FIG. 12, when the signal CAL of changing a setting of the counter is changed by the impedance of the power source, a setting which is optimum for the impedance of the power source, that is, which makes the change time to be the shortest can be constituted. In FIG. 15, in CASE4, the impedance of the power source is high, it is necessary to make the rate of changing the current small, and therefore, it is necessary to make the intervals of turning CCS1 through CCSn ON long by increasing the number of stages of the counter. Conversely, in CASE6, the impedance of the power source is low, the rate of changing the current can be set high, and therefore the intervals of turning CCS1 through CCSn ON can be shortened by reducing the number of stages of the counter. The impedance of the power source is determined by a resistor of a wiring of the power source inside the LSI or a capacitor added to the power source inside the LSI, a resistor of a wiring of the power source at a package or a board outside the LSI, or a capacitor mounted to a package or a board.

Figure 16B:
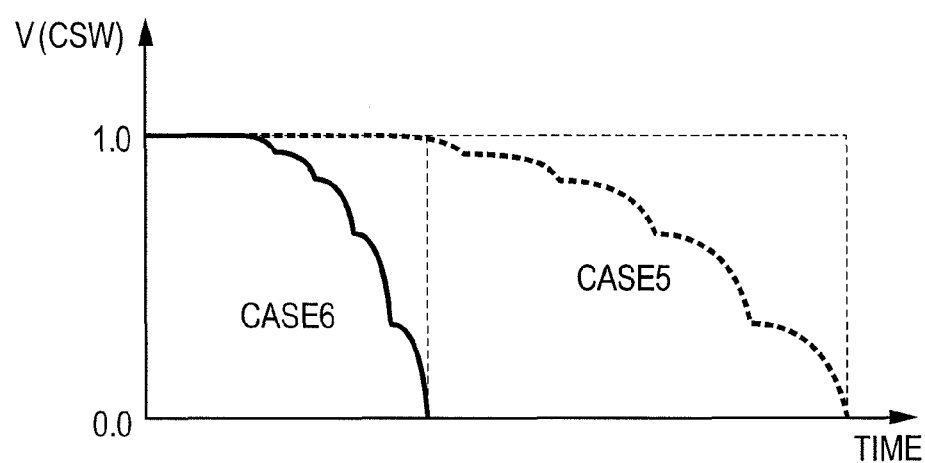
FIG. 16B is a waveform diagram showing a potential of a control signal of the power source switch in operation of the power source interrupting control circuit using the present invention.
Figure 16C:
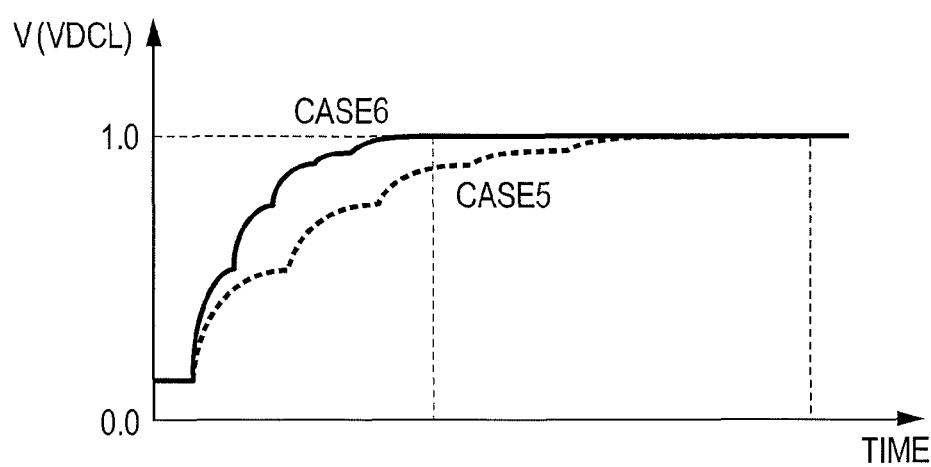
FIG. 16C is a waveform diagram showing a potential of a local power source in operation of the power source interrupting control circuit using the present invention.

FIG. 16A through FIG. 16C show changes in currents and voltages of respective portions of circuits in cases of CASE5 and CASE6. FIG. 16A shows a current flowing in the power source switch MPSW1, FIG. 16B shows a potential of the control signal CSW, and FIG. 16C shows a potential of the local power source line VDCL, respectively, and meanings of the ordinates are the same as those of corresponding drawings in FIGS. 2A, 2B, and 2C. Dotted lines of respective waveforms designate CASE5 and bold lines thereof designate CASE6. It is known that although in CASE6, changing time intervals become short, and in accordance therewith, the current changing rate becomes large, a time period required for recovery of the power source becomes short.

Figure 17:
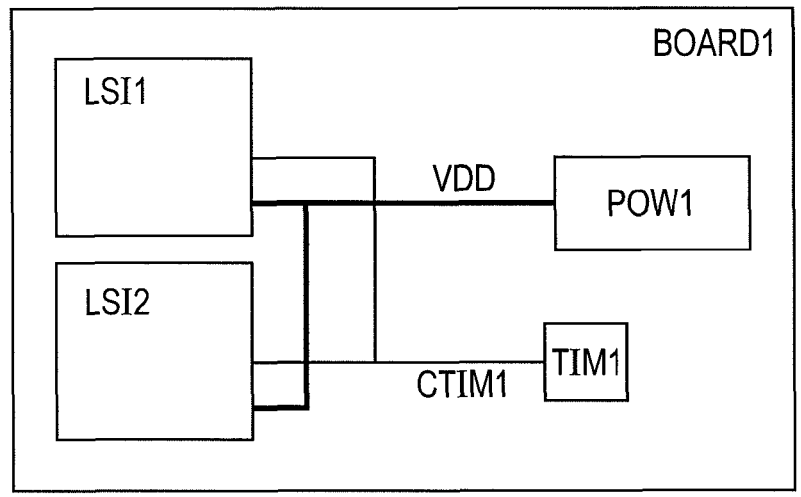
FIG. 17 is a diagram of constituting a board to which the present invention is applied.

FIG. 17 shows a constitution of a board to which the present invention is applied. In FIG. 17, notation BOARD1 designates a board for mounting LSI or the like, notations LSI1 and LSI2 designate LSIs of carrying out data processing, notation POW1 designates a power source IC of supplying a power source, notation TIM1 designates a control circuit of generating a signal of designating a timing, notation VDD designates a power source, and notation CTIM1 designates a signal of designating a timing. TIM1 can be constituted by an LSI for controlling a DIP switch or an LSI. On the board, the power source is supplied from POW1 which is a power source IC to LSI1 and LSI2, and the signal CTIM1 for controlling a timing in accordance with the impedance of the power source is supplied to LSI1 and LSI2.

Figure 18:
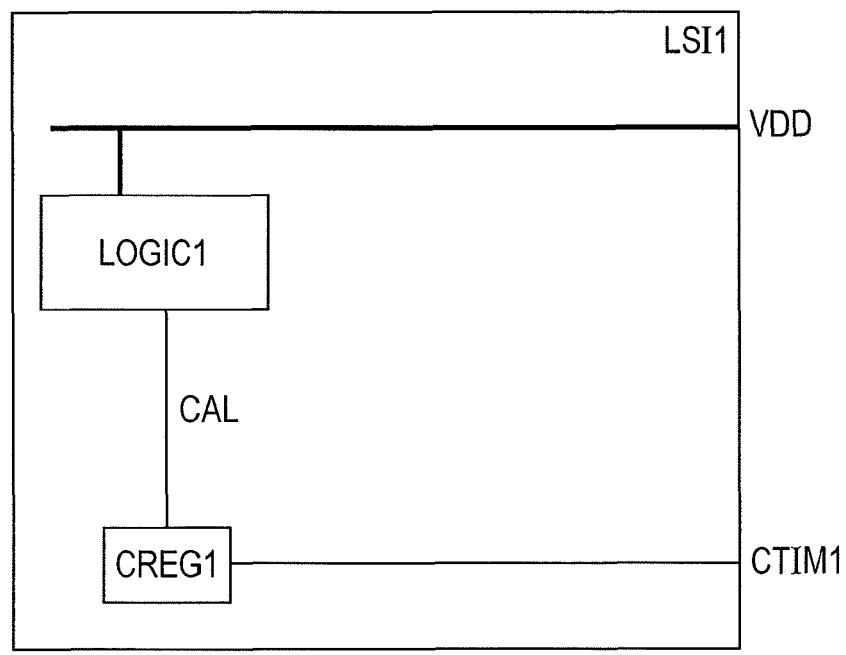
FIG. 18 is a diagram of constituting an internal circuit of LSI to which the present invention is applied.

FIG. 18 shows a constitution of an internal circuit of an LSI to which the signal CTIM1 of controlling a timing is supplied. In FIG. 18, notation LSI designates an LSI having a constant function, notation LOGIC1 designates a circuit block in which interruption of the power source is carried out, notation CREG1 designates a register, and notations CTIM1 and CAL designate signals of controlling timings. The timing control signal CTIM1 generated on the board as shown by FIG. 17 is inputted to inside of the LSI, and is preserved in the register CREG1. At CREG1, CTIM1 is outputted as it is or by decoding CTIM1 to be processed to a signal which can be inputted to the power source control circuit, as the timing control signal CAL. The current changing rate can be controlled by CAL by inputting CAL to a circuit for controlling an amount of a current in recovering from power source interruption as in FIG. 12.

Figures 19, 20:
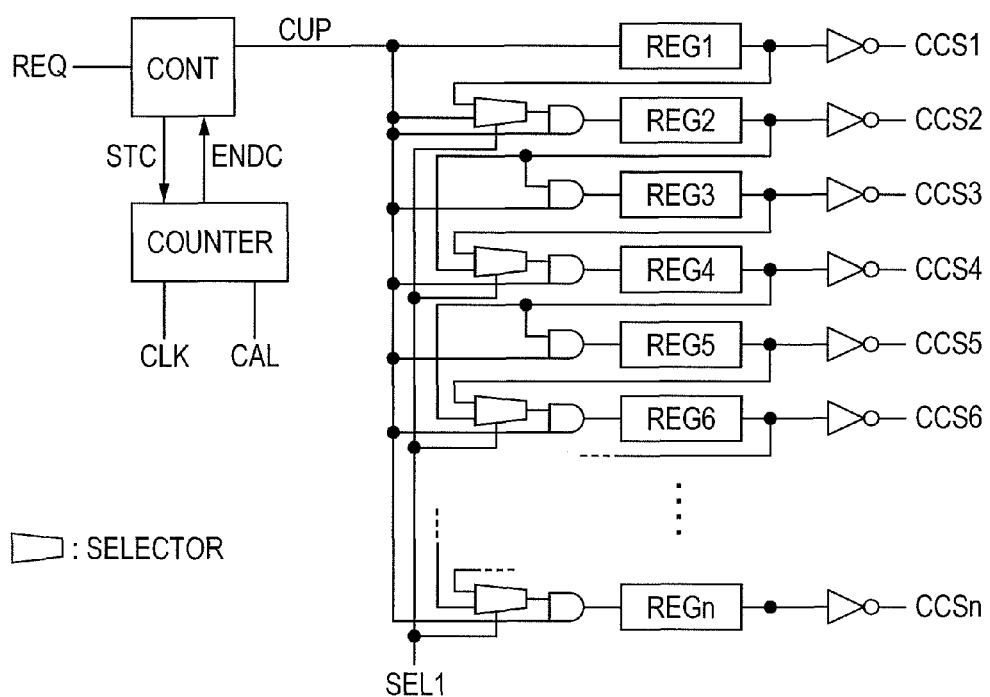
FIG. 19 shows a pattern of setting a counter stage number.
FIG. 20 is a circuit diagram of an operating signal outputting circuit in the power source interrupting control circuit using the present invention.

FIG. 19 shows an example of changing a number of stages of the counter of the circuit of FIG. 12, that is, the intervals of outputting CCS1 through CCSn by a response time period of the power source LSI of supplying power to an LSI to which the present invention is applied. Time intervals of turning CCS1 through CCSn ON, that is, the rate of changing the current flowing in the circuit block is restricted for preventing a noise from being generated by the impedance of the power source. Therefore, when a response time period of the power source IC is short, even in a case where the current is increased, the current can be supplied from the power source IC, and therefore, a noise can be restrained from being generated even by increasing the rate of changing the current, that is, making time intervals of changing the current short, or increasing an amount of the current increased at one time. That is, in FIG. 12, when the signal CAL for changing the setting of the counter by the response time period of the power source IC is changed, a setting which is optimum to the function of the power source IC, that is, a setting of making the change time the shortest can be constituted. In FIG. 19, in CASE7, since the response speed of the power source IC is slow, it is necessary to make the rate of changing the current small, and therefore, it is necessary to make the intervals of turning CCS1 through CCSn ON long by increasing the number of stages of the counter. Conversely, in CASE9, the response speed of the power source IC is fast, the rate of changing the current can be set high, and therefore, intervals of turning CCS1 through CCSn ON can be shortened by reducing the number of stages of the counter.

In this way, the board according to the present embodiment is provided with, at least, LSI1 having the circuit block LOGIC1, and the power source IC (POW1) for supplying the power source to LSI1, and LSI1 has a first state (power source interrupting state) and a second state (operating state) having power supplied to the circuit block LOGIC1 larger than that of the first state. Here, the first state and the second state respectively indicate a state in which an amount of supplying the power is relatively small and a state in which the amount of supplying the power is relatively large. For example, as shown by FIG. 1, the first state and the second state can also be realized by a standby state and an operating state.

Further, the LSI1 controls a shift from the first state to the second state based on the timing controlling signal CAL. Specifically, first control and second control designate control in which a rate of changing the current supplied to the circuit block LOGIC1 is relatively small and control in which the rate of changing the current is relatively large. The control can be realized by controlling the number of stages of the counter as explained, for example, in reference to FIG. 15 and FIG. 19. The smaller the counter stage number, the relatively larger the rate of changing the current.

Here, LSI1 receives the timing control signal CAL from outside thereof, and the timing control signal CAL is featured to be changed by the impedance of the power source line, or the response speed of the power source IC (POW1) with regard to the rate of changing the current supplied to the circuit block. In this way, by controlling the shift of LSI1 from the power source interrupting state to the operating state based on the timing control signal CAL which is changed in accordance with a condition outside the LSI, even when the same LSI is applied to various apparatuses, the power source control in accordance with a characteristic of the outside of the LSI of the power source impedances of the apparatuses or the response speed of the power source IC or the like can be realized. As a result thereof, the same LSI can be mounted to various apparatuses, a development cost can be reduced while the cost of developing LSI is being increased, which is advantageous in view of design.

As has been explained in reference to FIGS. 15 and 19, in the case where the impedance of the power source line is low, or the case where the response speed of the power source IC is at a high speed, the control of shifting from the power source interrupting state to the operating state (second control) can be carried out at higher speed. It is because these cases signify that the power source IC can sufficiently supply the current, and therefore, it is advantageous in view of the operation of the circuit to shift to the operating state at higher speed.

Although the timing control signal CAL is generated by the control circuit TIM1 in FIG. 17, the timing control signal CAL can also be generated by a method of generating the timing control signal CAL by, for example, the power source IC. However, particularly when the control circuit TIM1 generates the timing control signal CAL, a function of generating the timing control signal CAL is not needed for the power source IC. Further, in a case where the timing control signal CAL is generated based on the impedance of the power source line, since the impedance of the power source line needs to be determined inside the board regardless of the power source IC, it is preferable to provide the control circuit TIM1 separately from the power source IC. Further, by providing the control circuit TIM1 separately therefrom, the timing control signal CAL in accordance with a kind of an LSI mounted can also be generated.

Although the present embodiment particularly conceives the shift from the power source interrupting state to the operating state, even in a converse case, that is, in shifting from the operating state to the power source interrupting state, similar control can be carried out, and a similar operation and a similar effect are naturally achieved.

Although in the present embodiment, an example of using PMOS as the power source switch is shown, even in a constitution of using NMOS as the power source switch, by constituting the circuit by a similar way of thinking, the power source switch control restraining the power source noise can be carried out.

As described above, when the present invention is used, in an LSI having the power source interrupting function, the power source can be recovered without generating the power source noise in recovering from the power source interruption.

Second Embodiment

FIG. 20 shows a circuit of outputting a signal for successively turning current sources ON in a power source interrupting control signal using the present invention. The circuit is an example of the control circuit SEQ1 in FIG. 3. A circuit constitution of FIG. 20 is substantially equivalent to the circuit constitution of FIG. 12, and the circuit constitution of FIG. 20 differs from the circuit constitution of FIG. 12 in that a selecting signal SEL1 is inputted, thereby, timings of turning CCS1 through CCSn ON can be changed. As explained in the first embodiment, the current changing rate in recovering from power source interruption can be changed by the impedance of the power source or the response function of the power source IC.

Although in the first embodiment, the example of changing the current changing rate by changing the time intervals of turning CCS1 through CCSn ON is shown, the current changing rate can be changed also by changing the amount of the current changed by the change of one time. According to the present embodiment, a circuit constitution of changing the amount of the current changed in the change of one time is shown. In FIG. 20, notation SELECTOR designates a selector, a signal to be inputted is selected by a selecting signal SEL1 and is outputted. For example, when SEL1 is low, an output of REG1 is selected as an input to REG2, and an operation similar to that of the circuit of FIG. 12 is carried out. When SEL1 is high, CUP is selected as the input to REG2, and when CUP is initially inputted, CCS1 and CCS2 are selected. Further, an output of REG2 is selected as an input to REG4, and therefore, CCS3 and CCS4 are selected when CUP is inputted further successively.

Figure 21A:
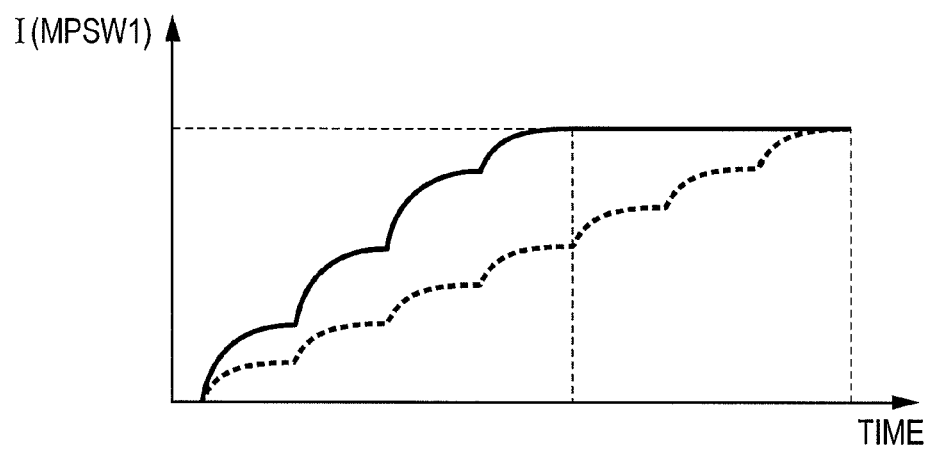
FIG. 21A is a waveform diagram showing a current flowing in a power source switch in operation of the power source interrupting control circuit using the present invention.
Figure 21B:
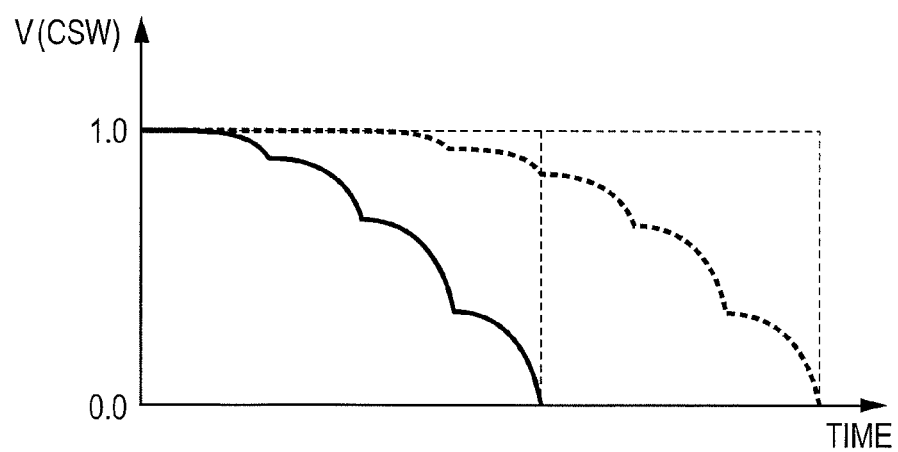
FIG. 21B is a waveform diagram showing a potential of a control signal of a power source switch in operation of the power source interrupting control circuit using the present invention.
Figures 21C, 22:
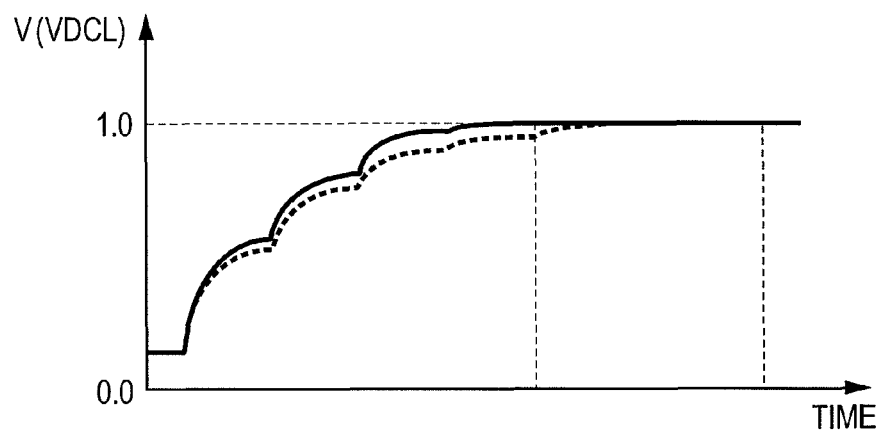
FIG. 21C is a waveform diagram showing a potential of a local power source in operation of the power source interrupting control circuit using the present invention.
FIG. 22 shows a pattern of setting a current control stage.

That is, when compared with the circuit of FIG. 12, a number of signals which are setting ON simultaneously is increased to double, in accordance therewith, a current of a circuit recovering from power source interruption is doubled in a change of one time, and also the current changing rate is doubled. FIG. 21A through FIG. 21C show the behavior. In FIGS. 21A, 21B, and 21C, bold lines show changes in a current and voltages when the embodiment is used, and dotted lines show changes in a current and voltages when the present invention of the first embodiment is used. FIG. 21A shows a current flowing in the power source switch MPSW1, FIG. 21B shows a potential of the control signal CSW, FIG. 21C shows a potential of the local power source line VDCL, respectively, and the meanings of the ordinates are the same as those of corresponding drawings in FIGS. 2A, 2B, and 2C. It is known from FIGS. 21A, 21B, and FIG. 21C that the rate of changing the current is doubled, and a time period required for recovering from power source interruption becomes about a half. Although in the present invention, an explanation has been given of the circuit constitution of controlling the current controlled in one time in two stages, the current can also be changed similarly in three or more stages.

FIG. 22 shows a relationship among a number of stages of a rate of changing a current, a power source impedance, and a response function of the power source IC. As has been explained in the first embodiment, the current changing rate can be increased when the power source impedance is low or the response function of the power source IC is at the high speed. Therefore, in a case of CASE11, the current changing rate can be increased by reducing the number of stages controlled. Conversely, in a case of CASE13, it is necessary to reduce the current changing rate by increasing the number of stages controlled. With regard to the signal SEL1, when the signal SEL1 is supplied to an LSI similar to CAL explained in the first embodiment, the current changing rate can be controlled by the power source impedance or the response function of the power source IC.

As described above, when the present invention according to the embodiment is used, in an LSI having the power source interrupting function, in recovering from power source interruption, a time period of recovery from power source interruption can be optimized without generating the power source noise.

Third Embodiment

Figure 23:
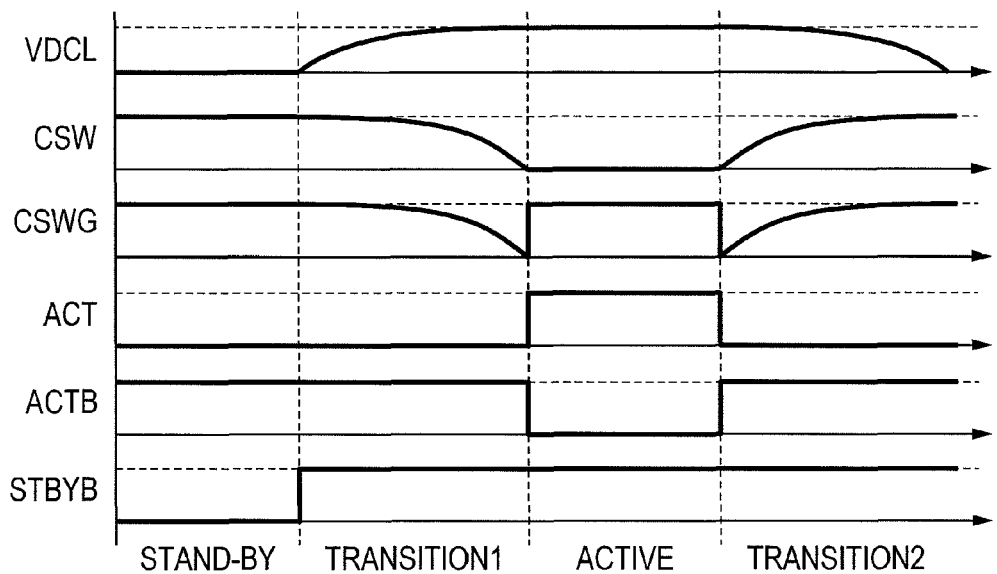
FIG. 23 shows a waveform of operating a circuit to which the present invention is applied.

An explanation will be given of other method of controlling the circuits of FIG. 3 and FIG. 8 using the present invention in reference to FIG. 23. FIG. 23 differs from FIG. 9 in a way of changing a state in TRANSITION2 in which the state of ACTIVE of operating the circuit block transits to the state of STAND-BY of interrupting the power source. In interrupting the power source, when the power source switch is turned OFF abruptly, the power source from the power source IC stays supplied, and there is a possibility of generating a noise in the power source line. Therefore, according to the constitution, in a case where the power source switch is shifted from the operating state to the standby state, the current changing rate of the current flowing in the circuit block is controlled so as not to exceed a predetermined value similar to a case where the standby state shifts to the operating state.

Further, the control in the case where the operating state shifts to the standby state can be applied independently from the control in a case of being operated from the standby state, and naturally achieves an effect of reducing the power source noise independently therefrom. Therefore, even when the present invention according to the present embodiment is applied only to the case where the operating state shifts to the standby state, and the standby state shifts to the operating state by the control of the background art, the effect of reducing the power source noise is achieved.

Figure 24:
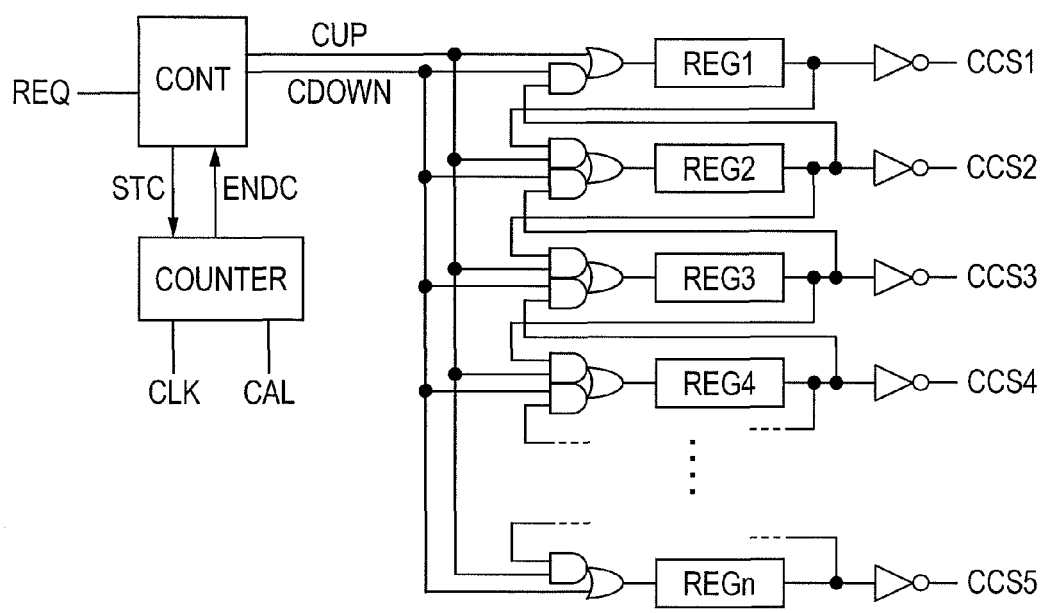
FIG. 24 is a circuit diagram of an operating signal outputting circuit in the power source interrupting control circuit using the present invention.
Figure 25A:
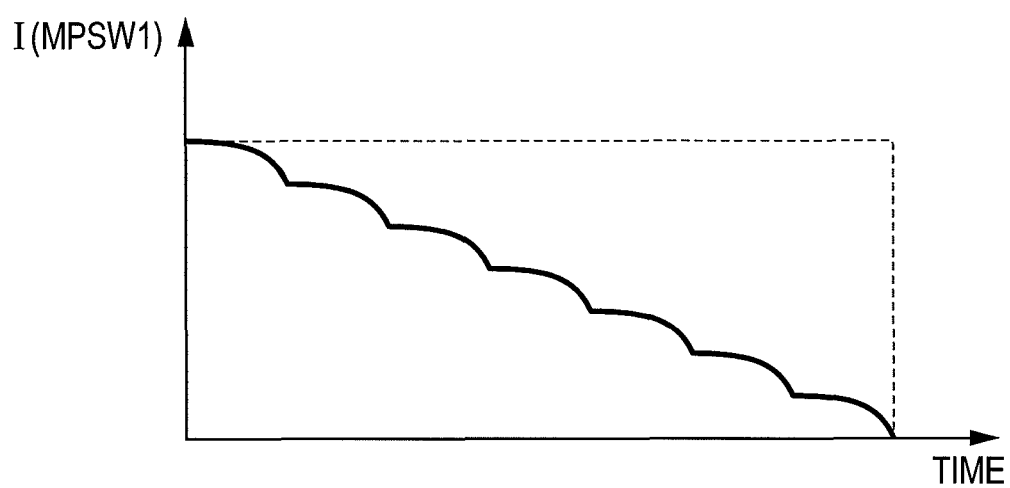
FIG. 25A is a waveform diagram showing a current flowing in a power source switch in operation of the power source interrupting control circuit using the present invention.
Figure 25B:
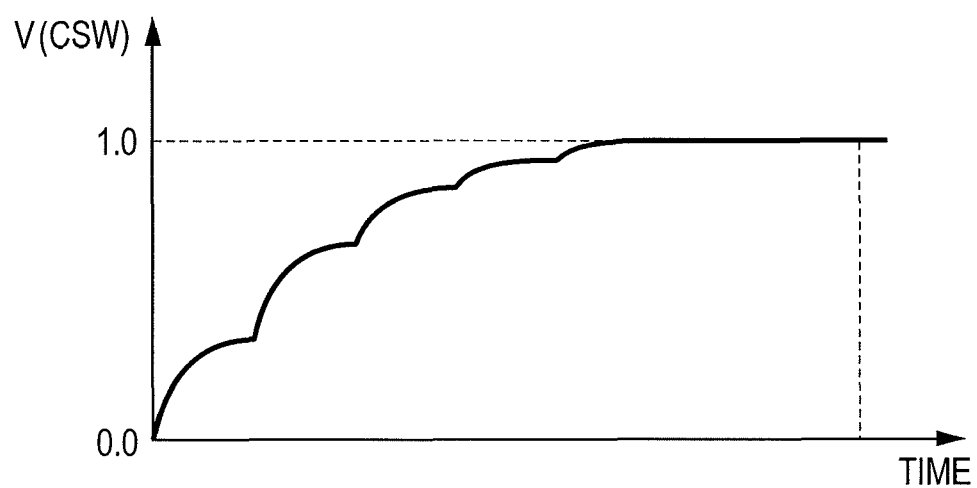
FIG. 25B is a waveform diagram showing a potential of a control signal of a power source switch in operation of the power source interrupting control circuit using the present invention.
Figure 25C:
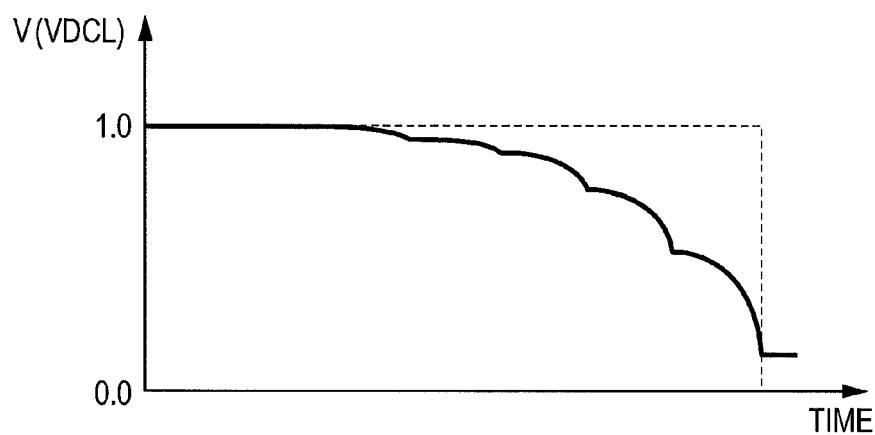
FIG. 25C is a waveform diagram showing a potential of a local power source in operation of the power source interrupting control circuit using the present invention.

FIG. 24 shows an example of the power source interrupting control circuit for realizing the waveform. Although the constitution of FIG. 24 is substantially equivalent to the circuit constitution of FIG. 12, the constitution of FIG. 24 differs therefrom in that there are two kinds of CUP and CDOWN in signals outputted from the control circuit CONT to the side of REG1 through REGn. In recovering from power source interruption, similar to the circuit operation of FIG. 12, CUP is outputted, CCS1 through CCSn successively become low from high, and the power source is recovered. In contrast thereto, in a case where the state of supplying the power source is shifted to the state of interrupting the power source, CDOWN is outputted, CCSn through CCS1 successively become high from low, and the power source is interrupted such that, for example, an output of REG2 is selected for an input of REG1, an output of REG3 is selected for an input of REG2 and so on. Thereby, even when the state of turning the power source ON is brought into the state of interrupting the power source, the state can be changed by maintaining the current changing rate constant. FIG. 25A through FIG. 25C show the change in the current and the changes in the potentials of the respective portions of the circuit at this occasion. FIG. 25A shows the current flowing in the power source switch MPSW1, FIG. 25B shows the potential of the control signal CSW, FIG. 25C shows the potential of the local power source line VDCL, respectively, and the meanings of the ordinates are the same as those of corresponding drawings in FIGS. 2A, 2B, and 2C. It is known that the current I (MPSW1) of the circuit block is reduced while maintaining the current changing rate constant.

As described above, when the present invention according to the present embodiment is used, in an LSI having the power source interrupting function, not only in recovering from the power source interruption, but in the transition from the state of supplying the power source to the power source interrupting state, the states can be transited without generating the power source noise.

Fourth Embodiment

Figure 26:
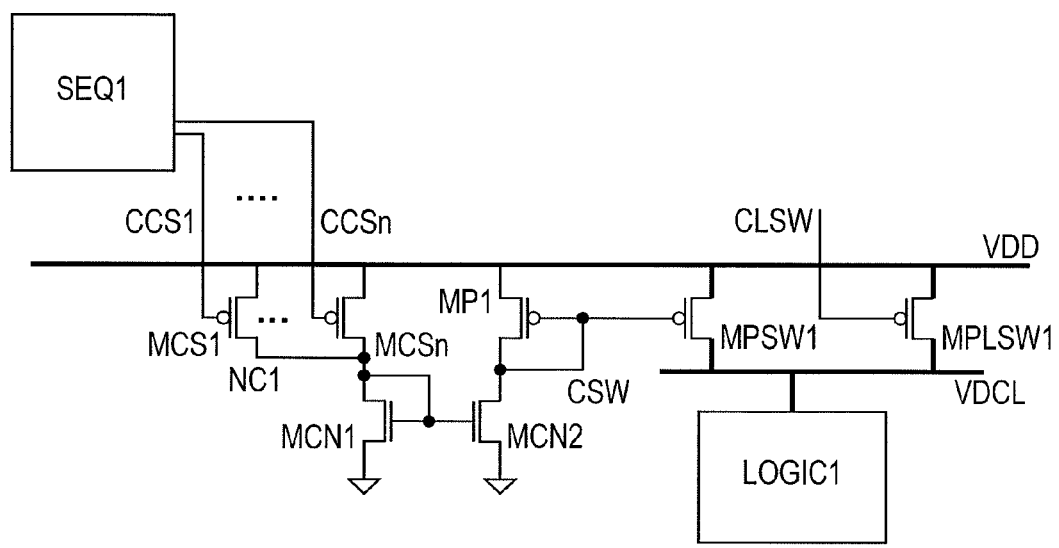
FIG. 26 is a circuit diagram including a variable current source portion of the power source interrupting control circuit using the present invention.

FIG. 26 shows an example of a circuit in a case where the variable current source portion of the power source interrupting control circuit using the present invention is constituted by a current source of PMOS and a current mirror. A circuit constitution of FIG. 26 is substantially equivalent to the circuit constitution of FIG. 3, and the circuit constitution of FIG. 26 differs therefrom in that a power source switch MPLSW1 and a control signal CLSW thereof are added. According to the constitution, the power source switch is divided into MPSW1 and MPLSW1, in recovering from the power source interruption, the current changing rate is restrained to a constant or less value by constituting the power source switch MPSW1 as a portion of the current mirror, and when the circuit block LOGIC1 is operated, a current consumed in LOGIC1 is supplied by supplying the current through the power source switch MPLSW1. According to the present constitution, a size of the power source switch MPSW1 constituting one side of the current mirror can be reduced, and therefore, the size of MP1 can be reduced while maintaining a mirror ratio similar to that in the case of the first embodiment, and a size of the control circuit can be reduced. Further, the potential of CSW is changed in analog. Therefore, although in a large circuit block, when CSW is supplied to an entire face of the circuit block, there is a possibility of changing the potential by a resistance of a wiring thereof, when the size of MPSW1 is reduced, MPSW1 may be supplied to a portion of the circuit block, and also the resistance of wiring does not pose a problem.

Figure 27:
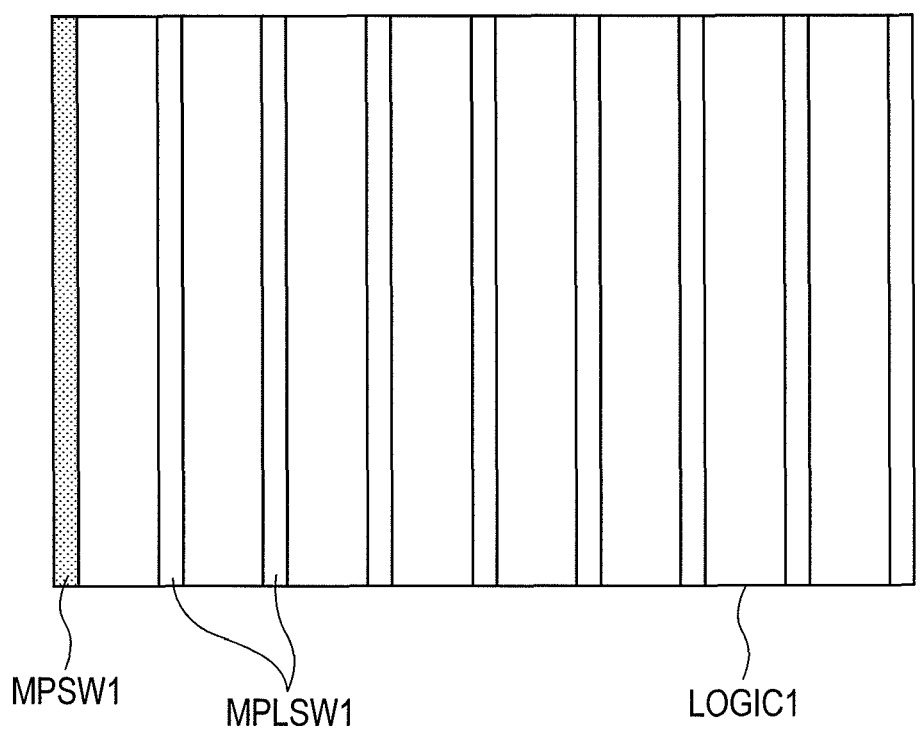
FIG. 27 is an outline layout diagram of arranging a switch of a circuit to which the present invention is applied.
Figure 28:
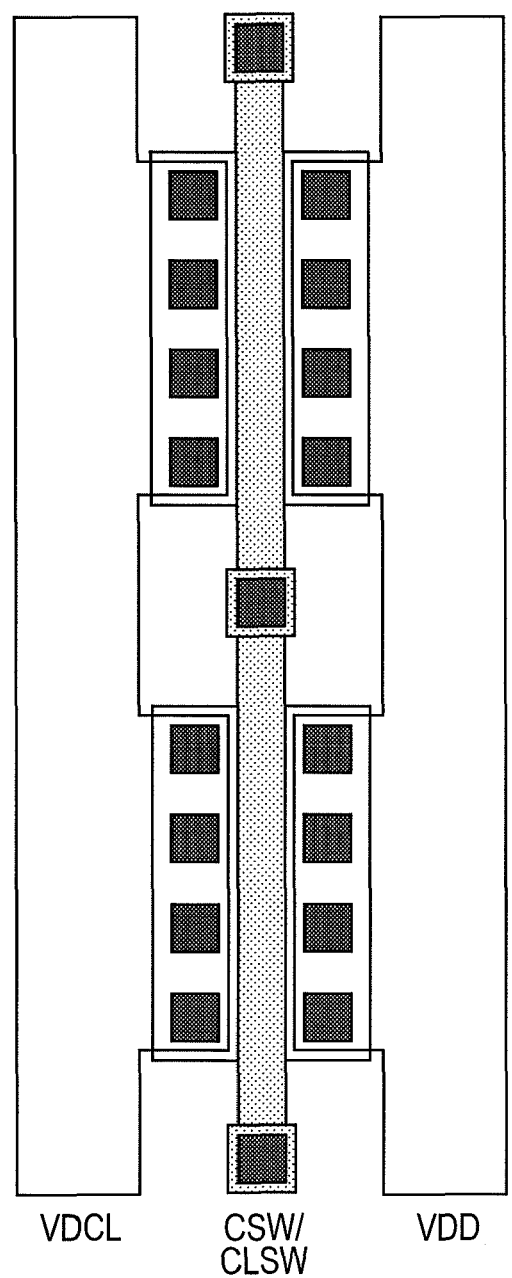
FIG. 28 is a layout diagram of a power source switch in a circuit to which the present invention is applied.

FIG. 27 shows an outline diagram of arranging the power source switch inside the circuit block LOGIC1. Unlike the constitution of FIG. 6, the switch MPSW1 which is controlled by CSW the potential of which is changed in analog is present only at the portion of the circuit, and a constitution which is easy to supply CSW is constructed. Further, with regard to CLSW, CLSW may take a low potential in the case where the circuit block LOGIC1 is operated, and may otherwise take a high potential, CLSW may be controlled in digital, and therefore, it is easy to distribute CLSW inside the circuit block. FIG. 28 shows an example of a layout of the power source switches MPSW1 and MPLSW1. With regard to constitutions of the switches, both of MPSW1 and MPLSW1 can be constructed by a similar constitution, and also a number of steps in design can be restrained to be small.

Figure 29:
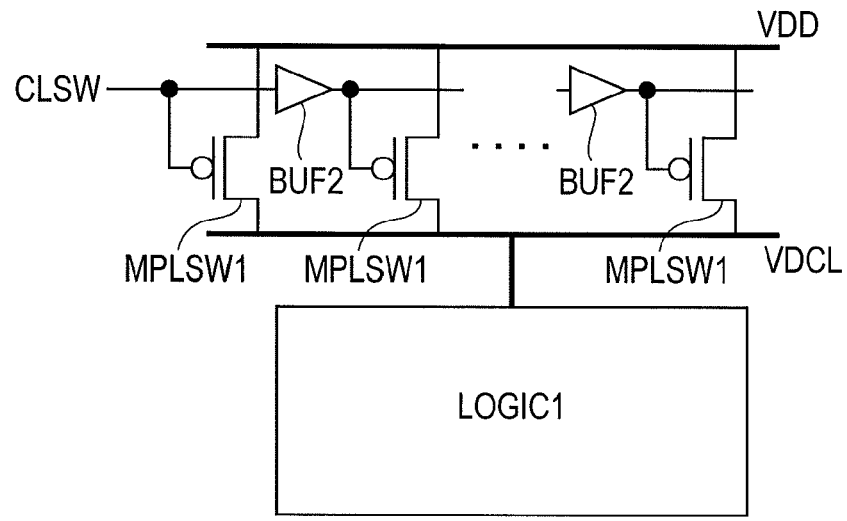
FIG. 29 is a circuit diagram of a power source switch control circuit to which the present invention is applied.
Figure 30:
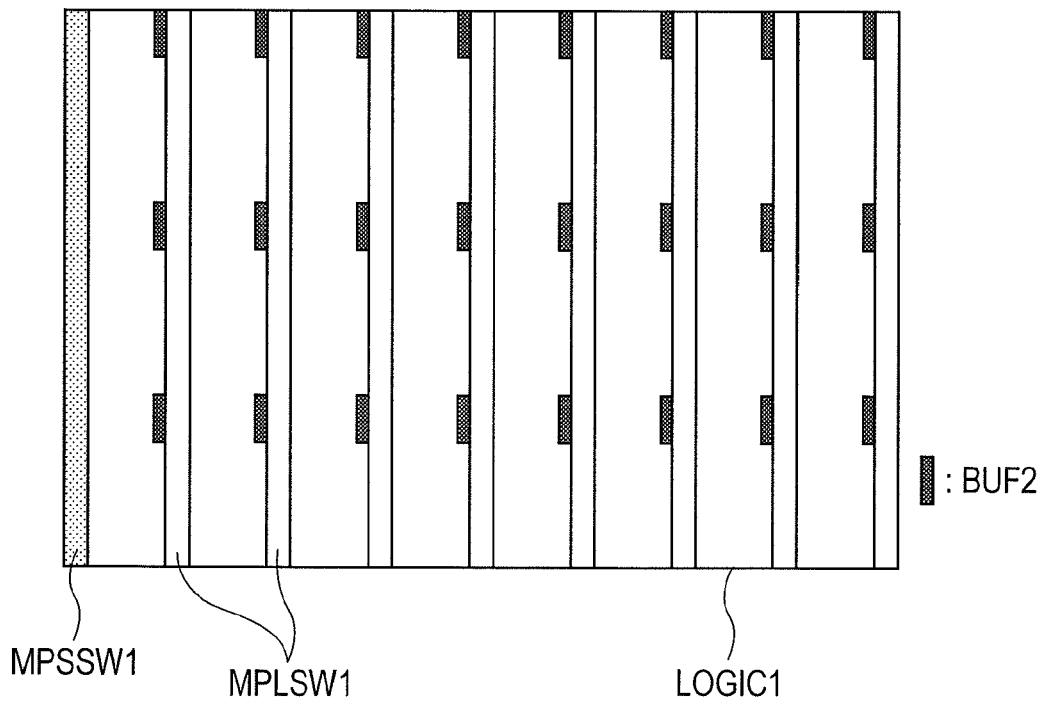
FIG. 30 is a layout diagram of a power source switch in a circuit to which the present invention is applied.

FIG. 29 shows a constitution of dividing the power source switch for distributing CLSW inside the circuit block. According to the first embodiment, in order to distribute CSW which takes an analog potential to inside of the circuit block, as signals of controlling the buffer circuit of driving CSW, two kinds of signals of ACT and STBYB need to be distributed additionally. However, according to the present circuit constitution, since the CLSW signal is operated as a digital signal, also an input signal to the buffer circuit BUF2 may be constituted by CLSW, and it is not necessary to distribute signals extraneously. FIG. 30 shows a constitution of the power source switch inside the circuit block including the buffer. In this way, even when the buffer circuits BUF2 are widely distributed inside the circuit block, control thereof can be constituted only by CLSW.

As described above, when the present invention according to the present embodiment is used, in an LSI having the power source interrupting function, when recovering from the power source interruption, or when transiting from the state of supplying the power source to the power source interrupting state, the states can be transited without generating the power source noise. Further, an area of the power source control circuit can be reduced, and circuits or signal wirings which are necessary for supplying the power source control signal can be reduced.

Fifth Embodiment

Figures 31, 32, 33:
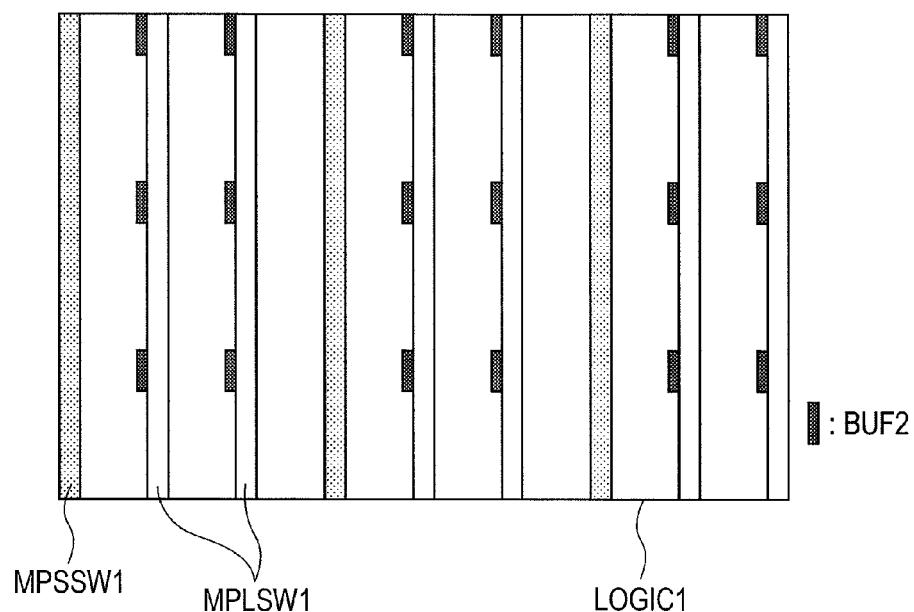
FIG. 31 is a layout diagram of a power source switch in a circuit to which the present invention is applied.
FIG. 32 shows an example of a size of a PMOS transistor constituting a current source in a case of constituting a circuit of the present invention.
FIG. 33 shows an example of a size of a PMOS transistor constituting a current source in a case of constituting a circuit of the present invention.
Figure 34A:
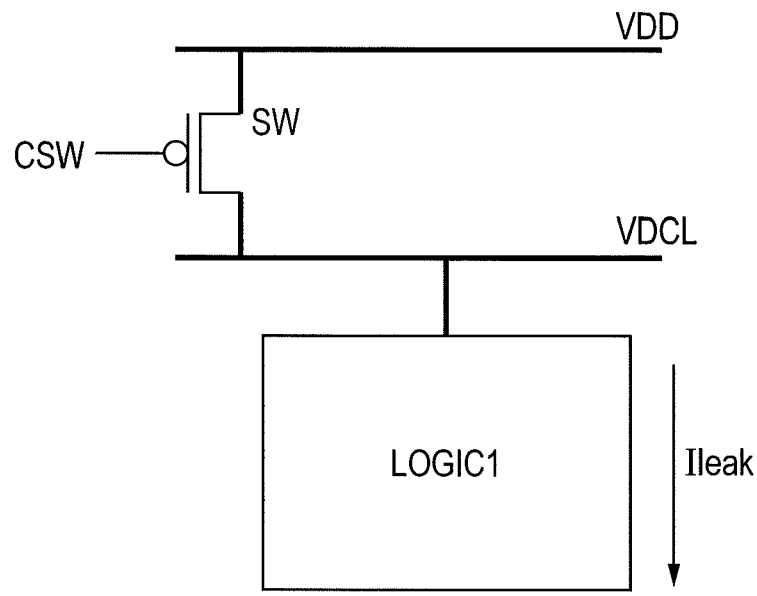
FIG. 34A is a diagram showing an outline of a power source interrupting technology.
Figure 34B:
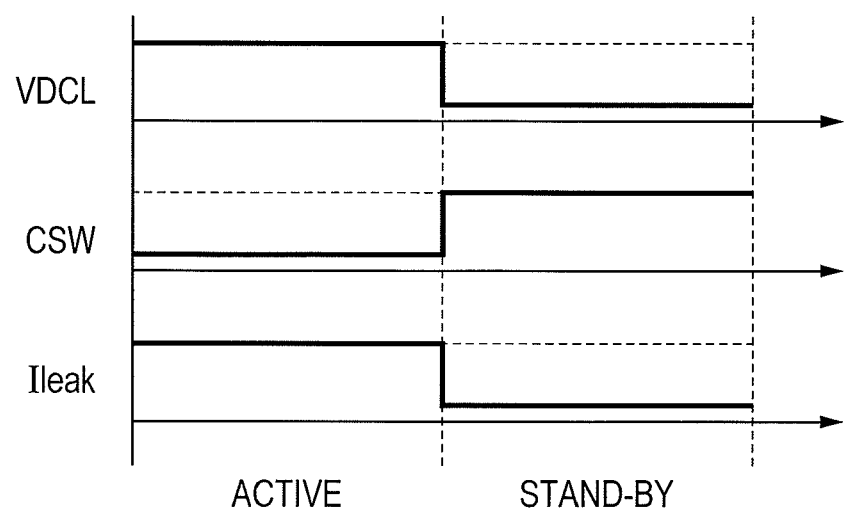
FIG. 34B is a timing chart showing an outline of the power source interrupting technology.

FIG. 31 shows a constitution of a power source switch inside a circuit block including a buffer. In a case of a size where the switch MPSW1 necessary for controlling the power source can be arranged only at a portion of the circuit block, the switches MPSW1 can be arranged at equal intervals inside a chip in this way. In this case, the buffer circuit BUF2 of driving CLSW is arranged at a vicinity of the power source switch MPLSW1 which is driven by CLSW.

As described above, when the present invention according to the present embodiment is used, in an LSI having the power source interrupting function, in recovering from the power source interruption, or in transiting from the state of supplying the power source to the power source interrupting state, the states can be transited without generating the power source noise. Further, even when the power source switch is divided into two kinds, the power source switch which is controlled in analog can be arranged.

Sixth Embodiment

FIG. 32 shows an example of a size of a PMOS transistor constituting a current source when the circuit of the present invention is constituted by the 65 nm process. When a transistor to be turned ON at a later stage is turned ON, it is necessary to make more currents flow since the potential of VDCL rises more than that at an initial stage. Therefore, a gate length L of a transistor having a small number is made larger than a gate length L of a transistor having a large number. Further, conversely, in a case of the same gate length, a gate width W of a transistor having a small number is made smaller than a gate width W of a transistor having a large number. However, when MCS1 through MCS3 are controlled, the potential of CSW hardly changes as shown by the circuit of FIG. 3 and the waveform diagrams FIGS. 4A, 4B, and 4C, and therefore, also currents flowing in the transistors can be made substantially the same. Therefore, the sizes of the transistors of MCS1 through MCS3 can be made the same.

As described above, when the present invention is used, in an LSI having the power source interrupting function, in recovering from the power source interruption, or in transiting from the state of supplying the power source to the power source interrupting state, the states can be transited without generating the power source noise.

Seventh Embodiment

FIG. 33 shows an example of a size of a PMOS transistor constituting a current source when the circuit of the present invention is constituted by the 65 nm process. In a case where a transistor to be turned ON at a later stage is turned ON, it is necessary to make more currents flow since the potential of VDCL is made to rise than that at an initial stage. Therefore, a gate length L of a transistor having a small number is made larger than a gate length L of a transistor having a large number. Further, conversely, in the case of the same gate length, a gate width W of a transistor having a small number is made smaller than a gate width W of a transistor having a large number. However, when MCS1 through MCS3 are controlled, since the potential of CSW hardly changes as shown by the circuit of FIG. 3 and waveform diagrams thereof of FIG. 4A through FIG. 4C, also currents flowing in the transistors can be made substantially the same. Therefore, there is a case where it is necessary to make the size of MCS2 smaller than the size of MCS1 in order to restrain the current changing rate to a constant value or less.

As described above, when the present invention according to the present embodiment is used, in an LSI having the power source interrupting function, when recovering from the standby state, or when transiting from the state of supplying the power source to the standby state, the states can be transited without generating the power source noise.

What is claimed is:

1. Information technology equipment comprising:
   a circuit block;
   a local power source line for supplying a power source to the circuit block;
   a power source line; and
   a first transistor provided with a source-drain path thereof between the power source line and the local power source line,
   wherein the first transistor is controlled to an OFF state in a first state of the circuit block, and controlled to an ON state in a second state of the circuit block;
   a second transistor; and
   an adjustable current source which provides a current that can be adjusted to a plurality of values;
   wherein a gate of the first transistor is connected to a gate of the second transistor;
   wherein a source of the second transistor is connected to the power source line;
   wherein a drain of the second transistor is connected to the gate of the first transistor, the gate of the second transistor, and the adjustable current source;
   wherein when circuit block is shifted from the first state to the second state, the first transistor is controlled by adjusting the current of the adjustable current source such that a rate of changing a current flowing in the source-drain path of the first transistor does not exceed a value predetermined to restrain power source noise due to leakage current of the circuit block.

2. The information technology equipment according to claim 1, wherein the adjustable current source includes a plurality of third transistors controlled to an ON state in a predetermined order.

3. The information technology equipment according to claim 2, wherein when a first gate length is constituted by a gate length of one of the plurality of third transistors controlled to the ON state at a preceding stage in the predetermined order, and a second gate length is constituted by a gate length of another of the plurality of third transistors controlled to the ON state at a later stage in the predetermined order, the first gate length is equal to the second gate length, or longer than the second gate length.

4. The information technology equipment according to claim 2, wherein the circuit block includes a fourth transistor, and the respective gate lengths of the plurality of third transistors are longer than a gate length of the fourth transistor.

5. The information technology equipment according to claim 2, wherein the adjustable current source further includes a current mirror circuit.

6. The information technology equipment according to claim 1, wherein in the second state of the circuit block, a potential of a gate of the first transistor is fixed to a ground potential or a power source potential.

7. The information technology equipment according to claim 1, wherein in the first state of the circuit block, a potential of a gate of the first transistor is fixed to a ground potential or a power source potential.

8. The information technology equipment according to claim 6, including a plurality of buffer circuits for fixing the potential of a line coupled to the gate of the first transistor.

9. The information technology equipment according to claim 2, wherein the plurality of third transistors are respectively activated at constant time intervals.

10. The information technology equipment according to claim 9, wherein the time intervals are controlled by a first control signal.

11. The information technology equipment according to claim 10, wherein the first control signal is supplied from an outside of the information technology equipment.

12. The information technology equipment according to claim 2, wherein a number of the plurality of third transistors is controlled by a second control signal.

13. The information technology equipment according to claim 1, further comprising:
   a fifth transistor provided with a source-drain path thereof between the power source line and the local power source line,
   wherein the fifth transistor is controlled to OFF in the first state, and to ON in the second state.

14. Information technology equipment comprising:
   a circuit block;
   a local power source line for supplying a power source to the circuit block,
   a power source line; and
   a first transistor provided with a source-drain path thereof between the power source line and the local power source line,
   wherein the first transistor is controlled to an OFF state in a first state of the circuit block, and to an ON state in a second state of the circuit block;
   a second transistor; and
   an adjustable current source which provides a current that can be adjusted to a plurality of values;
   wherein a gate of the first transistor is connected to a gate of the second transistor;

wherein a source of the second transistor is connected to the power source line;

wherein a drain of the second transistor is connected to the gate of the first transistor, the gate of the second transistor, and the adjustable current source;

wherein when circuit block is shifted from the second state to the first state, the first transistor is controlled by adjusting the current of the adjustable current source such that a rate of changing a current flowing in the source-drain path of the first transistor does not exceed a value predetermined to restrain power source noise due to leakage current of the circuit block.

15. Information technology equipment comprising:

an LSI including a circuit block and having a first state, and a second state in which power supplied to the circuit block is larger than power supplied to the circuit block in the first state; and a power source IC to supply power to the LSI by way of a power source line, wherein the LSI receives a control signal from outside of the LSI, and wherein the LSI selects first control for shifting to the second state or second control for shifting to the second state, based on the control signal when the first state shifts to the second state, and a rate of changing a current supplied to the circuit block in the second control is larger than a rate of changing the current supplied to the circuit block in the first control.

16. The information technology equipment according to claim 15, further comprising:

a first transistor provided with a source-drain path thereof between the power source line and the circuit block, wherein in the first state, the first transistor is brought into an OFF state, and wherein in the second state, the first transistor is brought into an ON state.

17. The information technology equipment according to claim 15, further comprising:

a control circuit for transmitting the control signal.

18. The information technology equipment according to claim 15, wherein the LSI further includes a local power source line for supplying the current to the circuit block, and a first transistor provided with a source-drain path thereof between the power source line and the local power source line, wherein the current is a current flowing in the source-drain path of the first transistor, and wherein in the first control and in the second control, the rate of changing the current does not exceed a value predetermined to restrain power source noise due to leakage current of the circuit block.

19. The information technology equipment according to claim 15, wherein in a case where the LSI selects the second control, in comparison with a case where the LSI selects the first control, an impedance of the power source line is low, or the response speed of the power source IC in correspondence with the rate of changing the current is high.

20. The information technology equipment according to claim 15, wherein the control signal is based on a power source impedance or a speed of the power source IC.

* * * * *